(12) United States Patent
Chuang

(10) Patent No.: US 12,133,374 B2
(45) Date of Patent: Oct. 29, 2024

(54) MEMORY DEVICE HAVING MEMORY CELL WITH REDUCED PROTRUSION

(71) Applicant: NANYA TECHNOLOGY CORPORATION, New Taipei (TW)

(72) Inventor: Ching-Kai Chuang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 426 days.

(21) Appl. No.: 17/582,193

(22) Filed: Jan. 24, 2022

(65) Prior Publication Data

US 2023/0240064 A1 Jul. 27, 2023

(51) Int. Cl.
*H10B 12/00* (2023.01)

(52) U.S. Cl.
CPC ........... *H10B 12/37* (2023.02); *H10B 12/038* (2023.02)

(58) Field of Classification Search
CPC ........ H10B 12/00; H10B 12/36; H10B 12/37; H10B 12/038; H10B 12/056; H01L 29/66; H01L 29/78; H01L 29/7853; H01L 29/66795
USPC ........................................................ 257/514
See application file for complete search history.

(56) References Cited

U.S. PATENT DOCUMENTS

| | | |
|---|---|---|
| 2008/0029828 A1 | 2/2008 | Oh et al. |
| 2008/0191247 A1 | 8/2008 | Yin et al. |
| 2014/0011330 A1 | 1/2014 | Zhu |
| 2016/0149055 A1 | 5/2016 | Yamazaki et al. |
| 2018/0190792 A1 * | 7/2018 | Peng ..................... H01L 21/3065 |
| 2020/0194676 A1 * | 6/2020 | Chang ................. H10K 59/1315 |
| 2021/0041392 A1 * | 2/2021 | Au ....................... G01N 27/3278 |

FOREIGN PATENT DOCUMENTS

| | | |
|---|---|---|
| CN | 103151257 A | 6/2013 |
| CN | 105590858 A | 5/2016 |
| TW | 201801140 A | 1/2018 |

OTHER PUBLICATIONS

Office Action and Search Report mailed on May 23, 2023 related to Taiwanese Application No. 111114037.
Office Action and Search Report mailed on Dec. 20, 2022 related to Taiwanese Application No. 111114037.
Notice of Allowance mailed on Dec. 20, 2022 related to Taiwanese Application No. 111114036.

* cited by examiner

*Primary Examiner* — Chuong A Luu
(74) *Attorney, Agent, or Firm* — Xuan Zhang

(57) ABSTRACT

The present application provides a memory device having a memory cell with reduced protrusion protruding from the memory cell. The memory device includes a semiconductor substrate having a fin portion protruding from a surface of the semiconductor substrate; a semiconductive layer disposed conformal to the fin portion; a conductive layer disposed over the semiconductive layer; an insulating layer disposed over the conductive layer; and a protrusion including a first protruding portion laterally protruding from the semiconductive layer and along the surface, a second protruding portion laterally protruding from the conductive layer and over the first protruding portion, and a third protruding portion laterally protruding from the insulating layer and over the second protruding portion, wherein the protrusion has an undercut profile.

11 Claims, 31 Drawing Sheets

MEMORY DEVICE HAVING MEMORY CELL WITH REDUCED PROTRUSION

TECHNICAL FIELD

The present disclosure relates to a memory device and a manufacturing method thereof, and more particularly, to a memory device having a memory cell with a reduced protrusion protruding from the memory cell, and a manufacturing method of the memory device.

DISCUSSION OF THE BACKGROUND

Dynamic random-access memory (DRAM) is a type of semiconductor arrangement for storing bits of data in separate capacitors within an integrated circuit (IC). DRAMs are commonly formed as trench capacitor DRAM cells. An advanced method of fabricating a buried gate electrode involves building a gate electrode of a transistor and a word line in a trench in an active area (AA) comprising a shallow trench isolation (STI) structure.

Over the past few decades, as semiconductor fabrication technology has continuously improved, sizes of electronic devices have been correspondingly reduced. As a size of a cell transistor is reduced to a few nanometers in length, short circuit or bridging may occur and thus may result in a failure during operation of the cell transistor and a significant drop in performance of the device. It is therefore desirable to develop improvements that address related manufacturing challenges.

SUMMARY

One aspect of the present disclosure provides a memory device. The memory device includes a semiconductor substrate having a fin portion protruding from a surface of the semiconductor substrate; a semiconductive layer disposed conformal to the fin portion; a conductive layer disposed over the semiconductive layer; an insulating layer disposed over the conductive layer; and a protrusion including a first protruding portion laterally protruding from the semiconductive layer and along the surface, a second protruding portion laterally protruding from the conductive layer and over the first protruding portion, and a third protruding portion laterally protruding from the insulating layer and over the second protruding portion, wherein the protrusion has an undercut profile, and the third protruding portion protrudes farther than the first protruding portion.

In some embodiments, the third protruding portion protrudes about 30 nm to about 300 nm from the insulating layer.

In some embodiments, an exterior angle between the protrusion and the surface is in a range of about 5° to about 50°.

In some embodiments, the undercut profile comprises a first inclined sidewall of the first protruding portion, a second inclined sidewall of the second protruding portion and a third inclined sidewall of the third protruding portion.

In some embodiments, the first inclined sidewall, the second inclined sidewall and the third inclined sidewall are substantially coplanar.

In some embodiments, the first inclined sidewall is coupled with the second inclined sidewall, and the second inclined sidewall is coupled with the third inclined sidewall.

In some embodiments, the second inclined sidewall is disposed between the first inclined sidewall and the third inclined sidewall.

In some embodiments, the semiconductive layer includes polysilicon.

In some embodiments, the conductive layer includes tungsten.

In some embodiments, the insulating layer includes oxide.

In some embodiments, a height of the protrusion from the surface is about 250 nm.

In some embodiments, the memory device further comprises a contact plug disposed over the semiconductor substrate, wherein the contact plug is separated from the protrusion by a distance substantially greater than 200 nm.

In some embodiments, the distance is substantially less than 500 nm.

In some embodiments, the contact plug includes tungsten.

Another aspect of the present disclosure provides a memory device. The memory device includes a semiconductor substrate having a fin portion protruding from a surface of the semiconductor substrate; a semiconductive layer disposed conformal to the fin portion and having a first protruding portion laterally protruding away from the fin portion and along the surface; a conductive layer disposed conformal to the semiconductive layer and having a second protruding portion laterally protruding away from the fin portion and over the first protruding portion; and an insulating layer disposed conformal to the conductive layer and having a third protruding portion laterally protruding away from the fin portion and over the second protruding portion, wherein a length of the third protruding portion is substantially less than 300 nm.

In some embodiments, the length is substantially greater than 30 nm.

In some embodiments, the first protruding portion is substantially longer than the second protruding portion.

In some embodiments, the second protruding portion is substantially longer than the third protruding portion.

In some embodiments, a first sidewall of the first protruding portion, a second sidewall of the second protruding portion and a third sidewall of the third protruding portion are substantially coplanar.

In some embodiments, the first sidewall is coupled with the second sidewall, and the second sidewall is coupled with the third sidewall.

In some embodiments, the second sidewall is disposed between the first sidewall and the third sidewall.

In some embodiments, the memory device further comprises a contact plug disposed over the semiconductor substrate, wherein the contact plug is separated from the first protruding portion by a distance of about 200 nm to about 500 nm.

In some embodiments, the contact plug is separated from the second protruding portion by the distance.

In some embodiments, the contact plug is separated from the third protruding portion by the distance.

Another aspect of the present disclosure provides a method of manufacturing a memory device. The method includes steps of providing a semiconductor substrate having a fin portion protruding from a surface of the semiconductor substrate; disposing a semiconductive material over the semiconductor substrate and conformal to the fin portion; disposing a conductive material over the semiconductive material; disposing an insulating material over the conductive material; disposing a patterned photoresist over the insulating material; applying an electric field at a first predetermined angle toward a plasma to remove a portion of the insulating material exposed through the patterned photoresist to form an insulating layer, to remove a portion of the conductive material under the portion of the insulating material to form a conductive layer, and to remove a portion of the semiconductive material under the portion of the insulating material to form a semiconductive layer; and removing the patterned photoresist from the insulating layer.

In some embodiments, the semiconductor substrate is rotated during the application of the electric field.

In some embodiments, the portion of the insulating material, the portion of the conductive material and the portion of the semiconductive material are removed by a dry etching process.

In some embodiments, the first predetermined angle is in a range of about 5° to about 50°.

In some embodiments, the method further comprises placing a cathode under the semiconductor substrate and placing an anode over the patterned photoresist and the insulating material.

In some embodiments, the anode is inclined at a second predetermined angle relative to the cathode, and the second predetermined angle is in a range of about 40° to about 85°.

In some embodiments, the plasma is bombarded on the portion of the insulating material, the portion of the conductive material or the portion of the semiconductive material at the first predetermined angle.

In some embodiments, the portion of the insulating material, the portion of the conductive material and the portion of the semiconductive material are removed sequentially or simultaneously.

In some embodiments, after the application of the electric field, the semiconductive layer includes a first protruding portion laterally protruding from the semiconductive layer and along the surface, the conductive layer includes a second protruding portion laterally protruding from the conductive layer and over the first protruding portion, and the insulating layer includes a third protruding portion laterally protruding from the insulating layer and over the second protruding portion.

In some embodiments, the method further comprises forming a contact plug over the semiconductor substrate and disposed adjacent to the first protruding portion, the second protruding portion and the third protruding portion.

In some embodiments, the contact plug is separated from the third protruding portion by a distance of about 200 nm to about 500 nm.

In conclusion, because an electric field at a predetermined angle is applied during a dry etching process, a plasma is bombarded on a memory cell at the predetermined angle to remove some portions of a semiconductive layer, a conductive layer and an insulating layer of the memory cell by the dry etching process. A protrusion formed and protruding from the semiconductive layer, the conductive layer and the insulating layer can be reduced or shortened. Therefore, a short circuit or bridging between the memory cell and a contact plug adjacent to the memory cell can be prevented or minimized.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
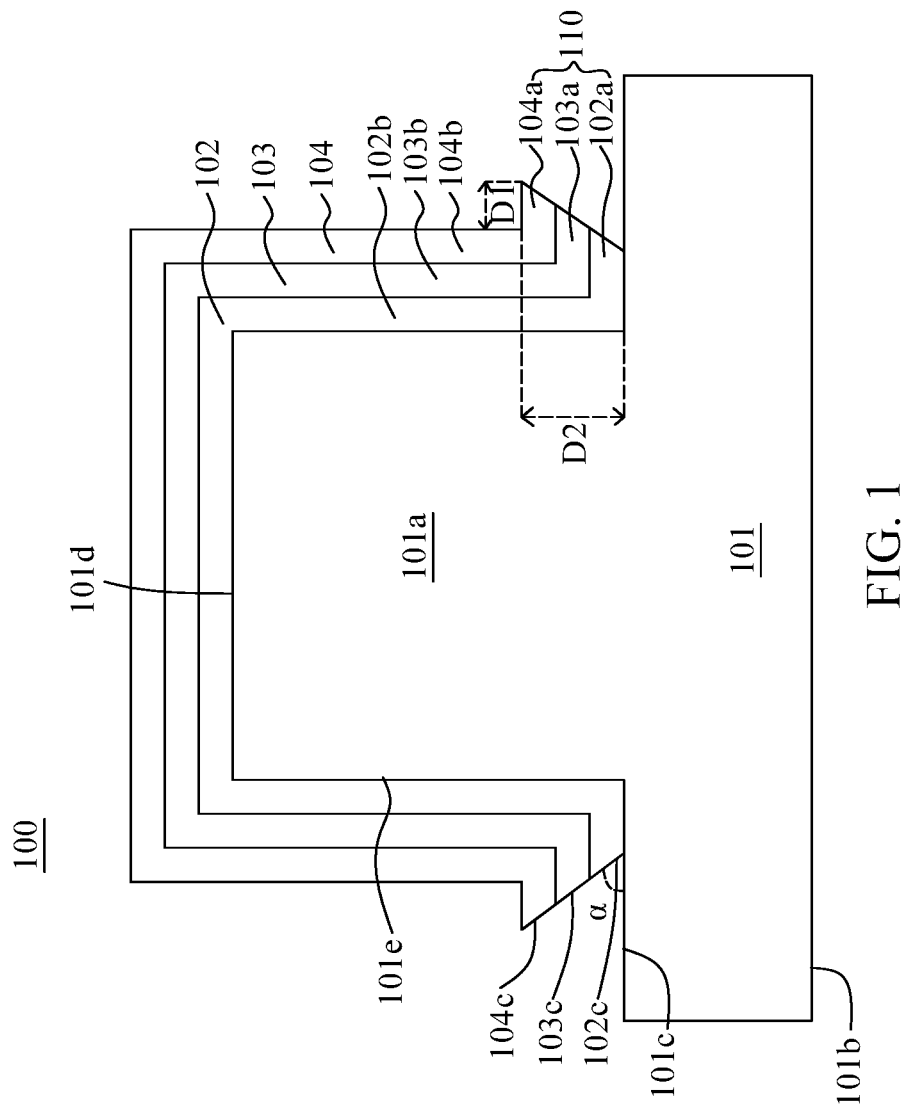
FIG. 1 is a cross-sectional side view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional side view of a memory device 100 in accordance with some embodiments of the present disclosure. In some embodiments, the memory device 100 includes a memory cell. In some embodiments, several memory cells are arranged in rows and columns in the memory device 100.

In some embodiments, the memory device 100 includes a semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes a bottom surface 101b and a top surface 101c opposite to the bottom surface 101b. In some embodiments, the top surface 101c is a front side of the semiconductor substrate 101, wherein electrical devices or components are subsequently formed over the top surface 101c and configured to electrically connect to an external circuitry. In some embodiments, the bottom surface 101b is a back side of the semiconductor substrate 101, where electrical devices or components are absent.

In some embodiments, the semiconductor substrate 101 includes a fin portion 101a extending from the top surface 101c and away from the bottom surface 101b of the semiconductor substrate 101. The fin portion 101a protrudes from the top surface 101c of the semiconductor substrate 101. In some embodiments, the fin portion 101a extends substantially upright over the semiconductor substrate 101. In some embodiments, the fin portion 101a has a top surface 101d above the top surface 101c of the semiconductor substrate 101.

In some embodiments, the memory device 100 includes a semiconductive layer 102 disposed conformal to and over the fin portion 101a. In some embodiments, the semiconductive layer 102 is disposed over the top surface 101c and the top surface 101d. In some embodiments, the semiconductive layer 102 includes polysilicon or polycrystalline silicon. In some embodiments, a thickness of the semiconductive layer 102 is in a range of about 50 nm to about 100 nm. In some embodiments, the thickness of the semiconductive layer 102 is in a range of about 80 nm to about 90 nm.

In some embodiments, the semiconductive layer 102 includes a first protruding portion 102a and a first elongated portion 102b coupled with the first protruding portion 102a. In some embodiments, the first protruding portion 102a laterally protrudes from the first elongated portion 102b and along the top surface 101c of the semiconductor substrate 101. In some embodiments, the first protruding portion 102a laterally extends away from the fin portion 101a.

In some embodiments, the first protruding portion 102a has a first inclined sidewall 102c inclined relative to the top surface 101c of the semiconductor substrate 101. In some embodiments, an exterior angle α between the first inclined sidewall 102c and the top surface 101C is in a range of about 5° to about 50°. In some embodiments, the first elongated portion 102b vertically extends along a sidewall 101e of the fin portion 101a. In some embodiments, the first protruding portion 102a is substantially orthogonal to the first elongated portion 102b.

In some embodiments, the memory device 100 includes a conductive layer 103 disposed conformal to and over the semiconductive layer 102. In some embodiments, the conductive layer 103 is disposed over the first protruding portion 102a and the first elongated portion 102b of the semiconductive layer 102. In some embodiments, the conductive layer 103 is disposed over the top surface 101c and the top surface 101d.

In some embodiments, the conductive layer 103 includes conductive material such as tungsten (W). In some embodiments, a thickness of the conductive layer 103 is in a range of about 50 nm to about 100 nm. In some embodiments, the thickness of the conductive layer 103 is in a range of about 80 nm to about 90 nm.

In some embodiments, the conductive layer 103 includes a second protruding portion 103a and a second elongated portion 103b coupled with the second protruding portion 103a. In some embodiments, the second protruding portion 103a laterally protrudes from the second elongated portion 103b and along the first protruding portion 102a of the semiconductive layer 102. In some embodiments, the second protruding portion 103a laterally extends away from the fin portion 101a.

In some embodiments, the second protruding portion 103a has a second inclined sidewall 103c inclined relative to the top surface 101c of the semiconductor substrate 101. In some embodiments, the exterior angle α between the second inclined sidewall 103c and the top surface 101c is in a range of about 5° to about 50°.

In some embodiments, the second inclined sidewall 103c is coupled with and substantially coplanar with the first inclined sidewall 102c. In some embodiments, the second elongated portion 103b vertically extends along the first elongated portion 102b of the semiconductive layer 102. In some embodiments, the second protruding portion 103a is substantially orthogonal to the second elongated portion 103b.

In some embodiments, the memory device 100 includes an insulating layer 104 disposed conformal to and over the conductive layer 103. In some embodiments, the insulating layer 104 is disposed over the second protruding portion 103a and the second elongated portion 103b of the conductive layer 103. In some embodiments, the insulating layer 104 is disposed over the top surface 101c and the top surface 101d.

In some embodiments, the insulating layer 104 includes an insulating material, such as silicon oxide, silicon nitride, silicon oxynitride, the like, or a combination thereof. In some embodiments, a thickness of the insulating layer 104 is in a range of about 50 nm to about 100 nm. In some embodiments, the thickness of the insulating layer 104 is in a range of about 80 nm to about 90 nm.

In some embodiments, the insulating layer 104 includes a third protruding portion 104a and a third elongated portion 104b coupled with the third protruding portion 104a. In some embodiments, the third protruding portion 104a laterally protrudes from the third elongated portion 104b and along the second protruding portion 103a of the conductive layer 103. In some embodiments, the third protruding portion 104a laterally extends away from the fin portion 101a.

In some embodiments, the third protruding portion 104a has a third inclined sidewall 104c inclined relative to the top surface 101c of the semiconductor substrate 101. In some embodiments, the exterior angle α between the third inclined sidewall 104c and the top surface 101c is in a range of about 5° to about 50°. In some embodiments, the third inclined sidewall 104c is coupled with the second inclined sidewall 103c. In some embodiments, the third inclined sidewall 104c is substantially coplanar with the second inclined sidewall 103c and the first inclined sidewall 102c.

In some embodiments, the second inclined sidewall 103c is disposed between the first inclined sidewall 102c and the third inclined sidewall 104c. In some embodiments, the third elongated portion 104b vertically extends along the second elongated portion 103b of the conductive layer 103. In some embodiments, the third protruding portion 104a is substantially orthogonal to the third elongated portion 104b.

In some embodiments, the memory device 100 includes a protrusion 110 comprising the first protruding portion 102a, the second protruding portion 103a and the third protruding portion 104a. In some embodiments, the protrusion 110 has an undercut profile. In some embodiments, the third protruding portion 104a protrudes from the first protruding portion 102a and the second protruding portion 103a. In some embodiments, the undercut profile comprises the first inclined sidewall 102c of the first protruding portion 102a, the second inclined sidewall 103c of the second protruding portion 103a and the third inclined sidewall 104c of the third protruding portion 104a.

In some embodiments, the third protruding portion 104a protrudes from the third elongated portion 104b by a length D1 of about 30 nm to about 300 nm. In some embodiments, a height D2 of the protrusion 110 from the top surface 101c is about 250 nm. In some embodiments, the exterior angle α between the protrusion 110 and the top surface 101c is in a range of about 5° to about 50°.

Figure 2:
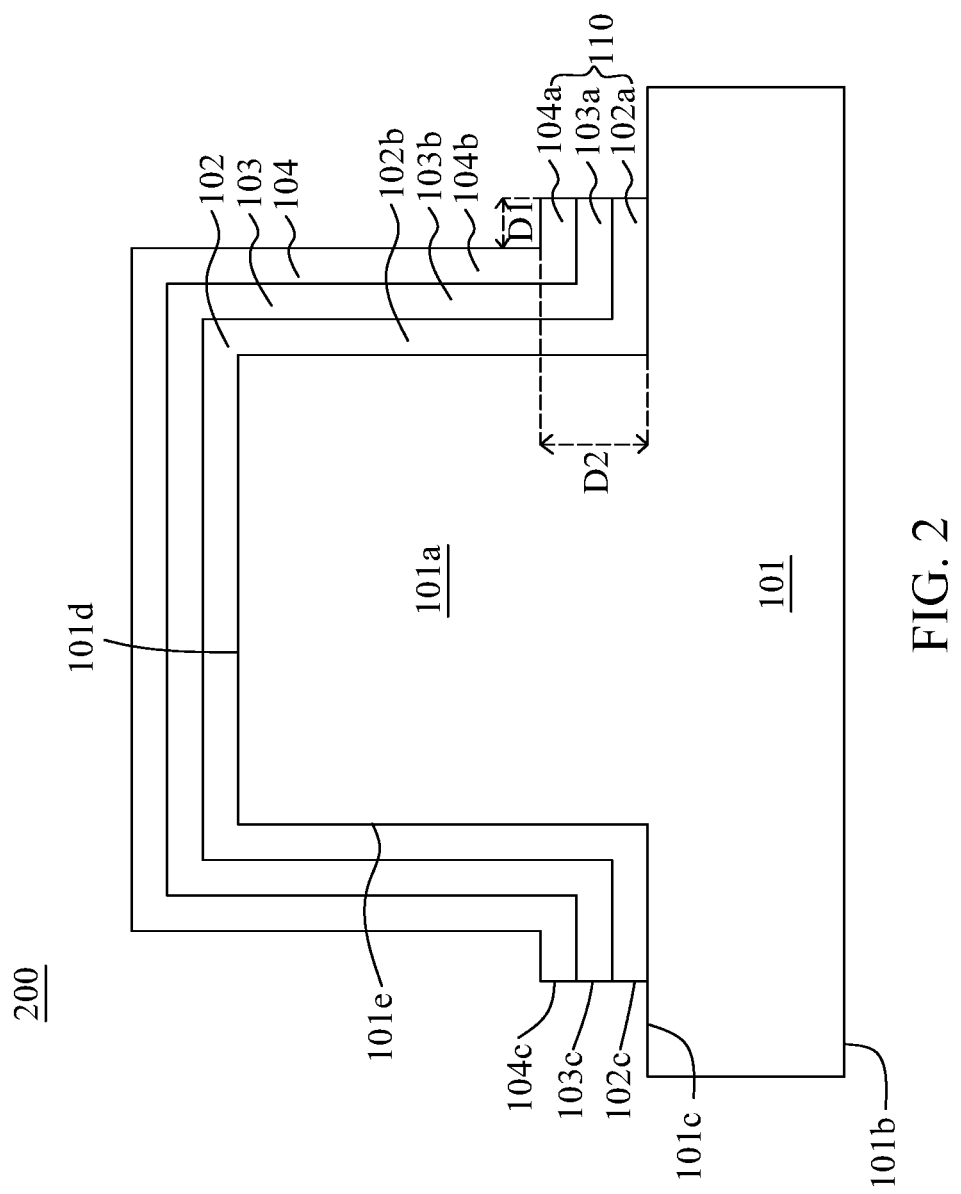
FIG. 2 is a cross-sectional side view of a memory device in accordance with other embodiments of the present disclosure.

FIG. 2 is a schematic cross-sectional side view of a memory device 200 in accordance with some embodiments of the present disclosure. The memory device 200 is similar to the memory device 100 of FIG. 1, except the protrusion 110 has a vertical profile. In some embodiments, the first protruding portion 102a has a first vertical sidewall 102c, the second protruding portion 103a has a second vertical sidewall 103c, and the third protruding portion 104a has a third vertical sidewall 104c. In some embodiments, the first vertical sidewall 102c, the second vertical sidewall 103c and the third vertical sidewall 104c are substantially coplanar. In some embodiments, the first vertical sidewall 102c is coupled with the second vertical sidewall 103c, and the second vertical sidewall 103c is coupled with the third vertical sidewall 104c.

In some embodiments, the second vertical sidewall 103c is disposed between the first vertical sidewall 102c and the third vertical sidewall 104c. In some embodiments, a length D1 of the third protruding portion 104a is substantially less than 300 nm. In some embodiments, the length D1 is substantially greater than 30 nm. In some embodiments, the first protruding portion 102a is substantially longer than the second protruding portion 103a. In some embodiments, the second protruding portion 103a is substantially longer than the third protruding portion 104a.

Figure 3:
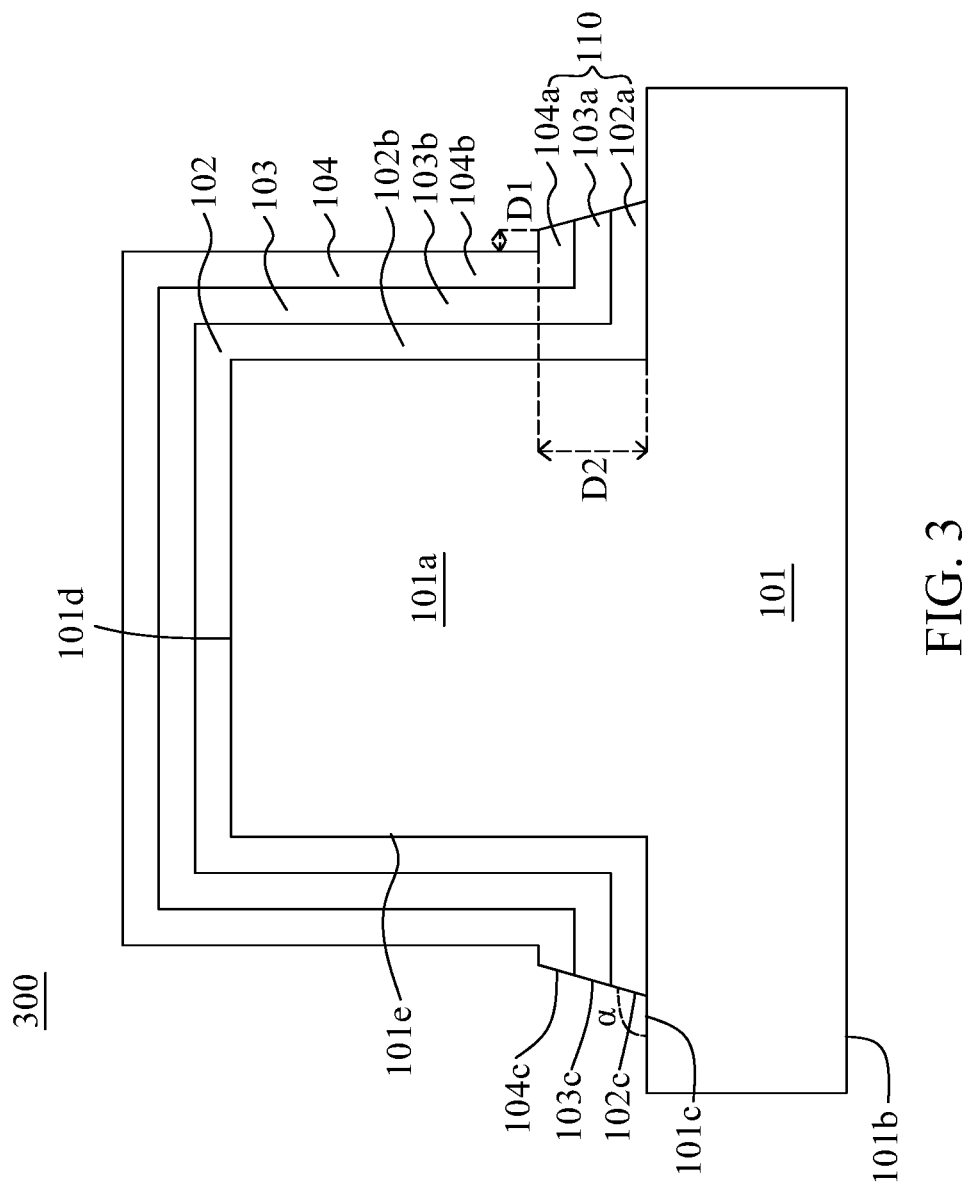
FIG. 3 is a cross-sectional side view of a memory device in accordance with other embodiments of the present disclosure.

FIG. 3 is a schematic cross-sectional side view of a memory device 300 in accordance with some embodiments of the present disclosure. The memory device 300 is similar to the memory device 100 of FIG. 1, except the protrusion 110 has an overcut profile. In some embodiments, the exterior angle α between the protrusion 110 and the top surface 101c is substantially greater than 90°. In some embodiments, the first protruding portion 102a protrudes farther than the third protruding portion 104a. In some embodiments, the length D1 of the third protruding portion 104a is in a range of about 30 nm to about 300 nm. In some embodiments, the first protruding portion 102a is substantially longer than the second protruding portion 103a. In some embodiments, the second protruding portion 103a is substantially longer than the third protruding portion 104a.

Figure 4:
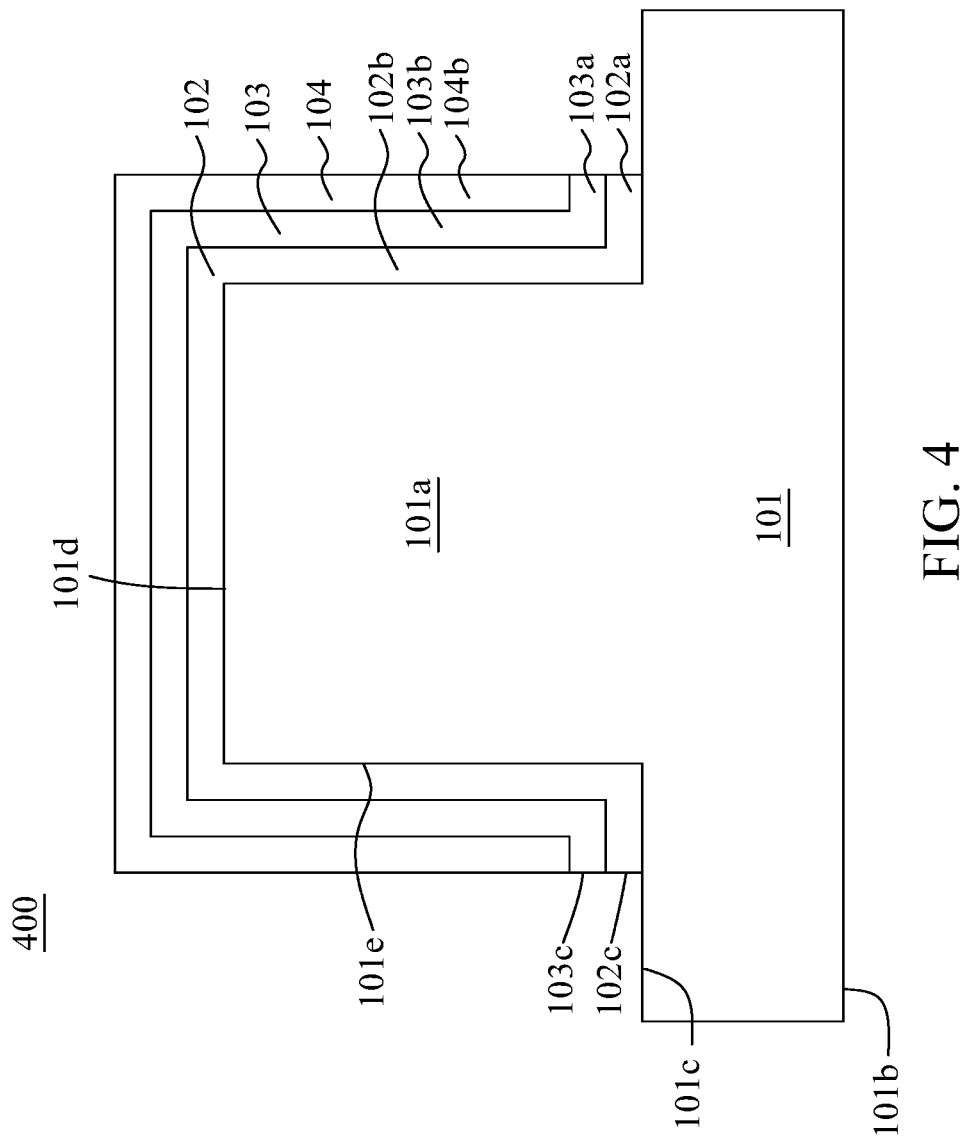
FIG. 4 is a cross-sectional side view of a memory device in accordance with other embodiments of the present disclosure.

FIG. 4 is a schematic cross-sectional side view of a memory device 400 in accordance with some embodiments of the present disclosure. The memory device 400 is similar to the memory device 200 of FIG. 2, except the third protruding portion 104a is absent. In some embodiments, the second vertical sidewall 103c, the first vertical sidewall 102c and a sidewall of the third elongated portion 104b are substantially coplanar. In some embodiments, the sidewall of the third elongated portion 104b is coupled with the second vertical sidewall 103c.

Figure 5:
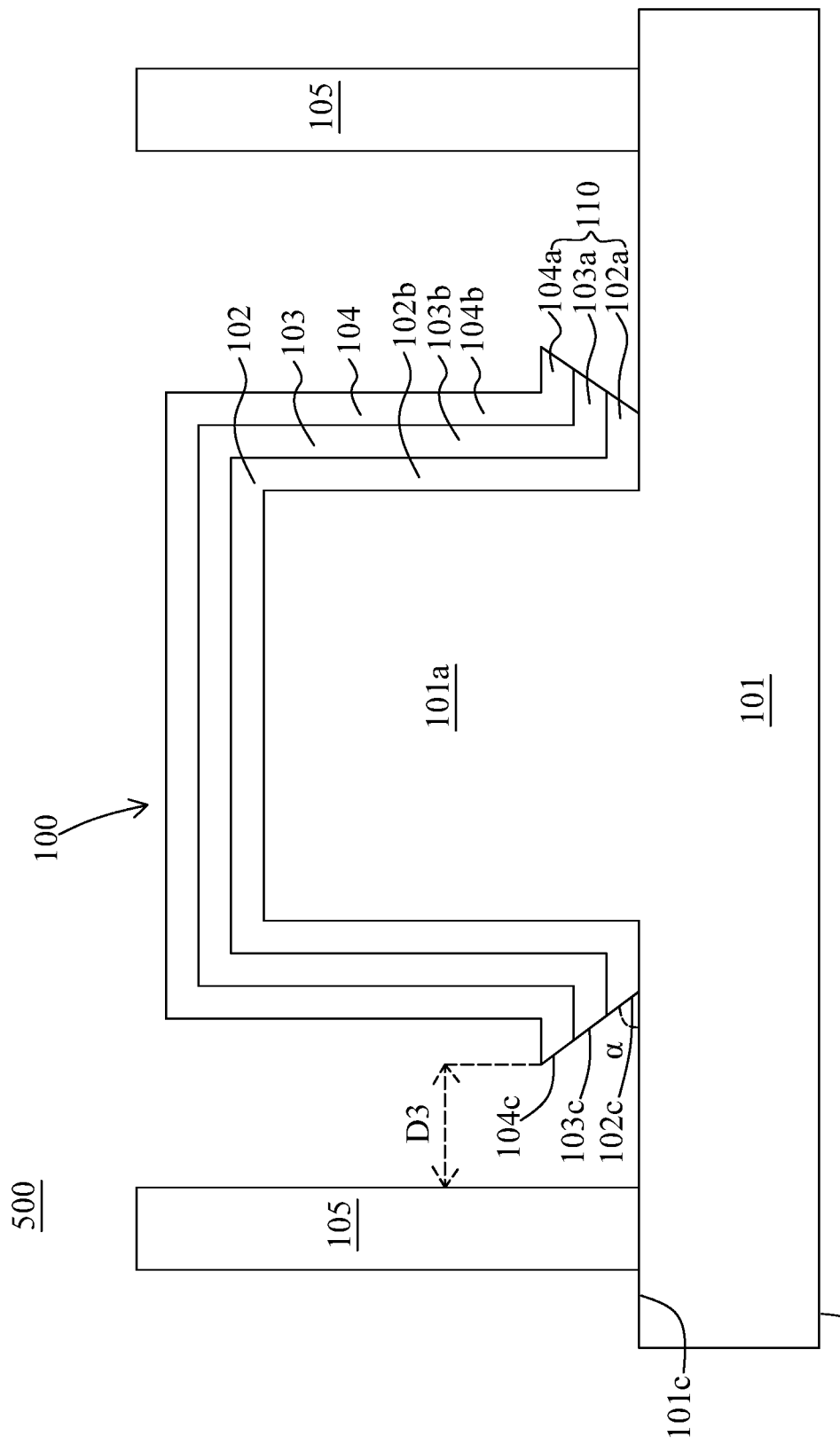
FIG. 5 is a cross-sectional side view of a memory device in accordance with some embodiments of the present disclosure.

FIG. 5 is a schematic cross-sectional side view of a memory device 500 in accordance with some embodiments of the present disclosure. The memory device 500 includes the memory device 100 of FIG. 1 and a contact plug 105 disposed over the semiconductor substrate 101. In some embodiments, the contact plug 105 includes conductive material such as tungsten (W). In some embodiments, the contact plug is separated from the protrusion 110 by a distance D3 substantially greater than 200 nm. In some embodiments, the distance D3 is substantially less than 500 nm. In some embodiments, the contact plug is separated from the third protruding portion 104a by the distance D3.

Figure 6:
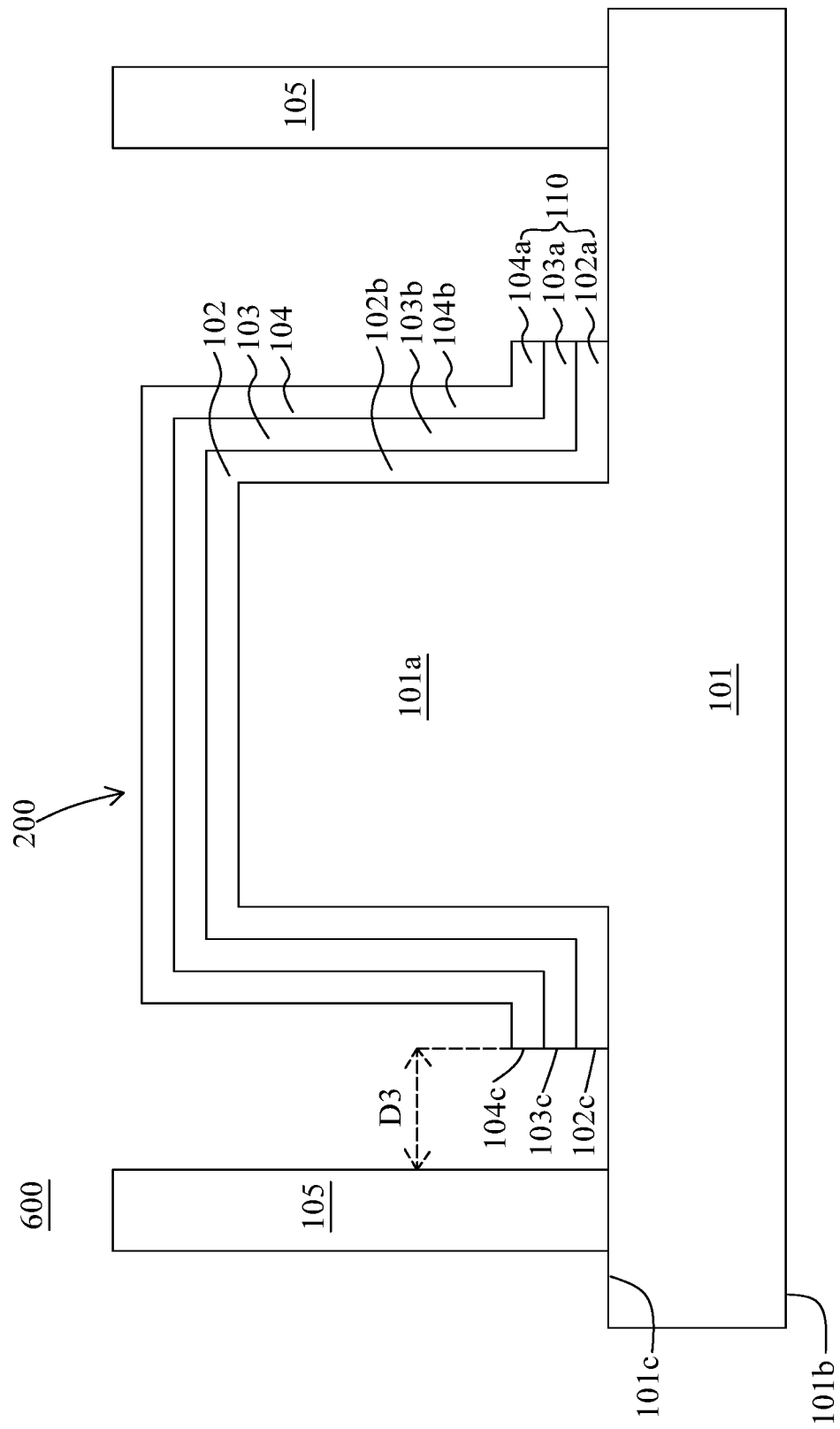
FIG. 6 is a cross-sectional side view of a memory device in accordance with other embodiments of the present disclosure.

FIG. 6 is a schematic cross-sectional side view of a memory device 600 in accordance with some embodiments of the present disclosure. The memory device 600 includes the memory device 200 of FIG. 2 and the contact plug 105 disposed over the semiconductor substrate 101. In some embodiments, the contact plug 105 is separated from the first protruding portion 102a by the distance D3 of about 200 nm to about 500 nm. In some embodiments, the contact plug 105 is separated from the second protruding portion 103a or the third protruding portion 104a by the distance D3.

Figure 7:
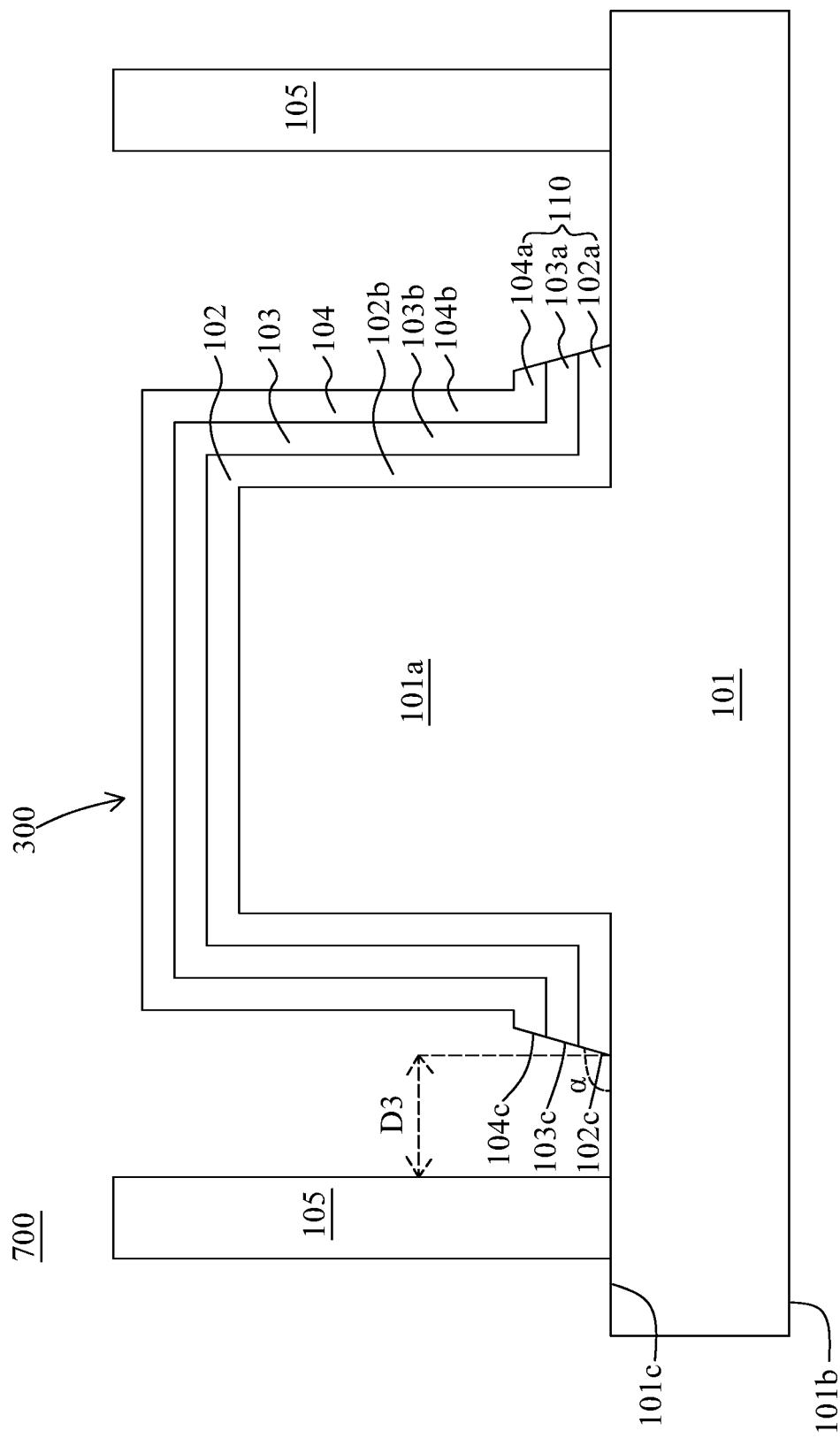
FIG. 7 is a cross-sectional side view of a memory device in accordance with other embodiments of the present disclosure.

FIG. 7 is a schematic cross-sectional side view of a memory device 700 in accordance with some embodiments of the present disclosure. The memory device 700 includes the memory device 300 of FIG. 3 and the contact plug 105 disposed over the semiconductor substrate 101. In some embodiments, the contact plug 105 is separated from the first protruding portion 102a by the distance D3 of about 200 nm to about 500 nm.

Figure 8:
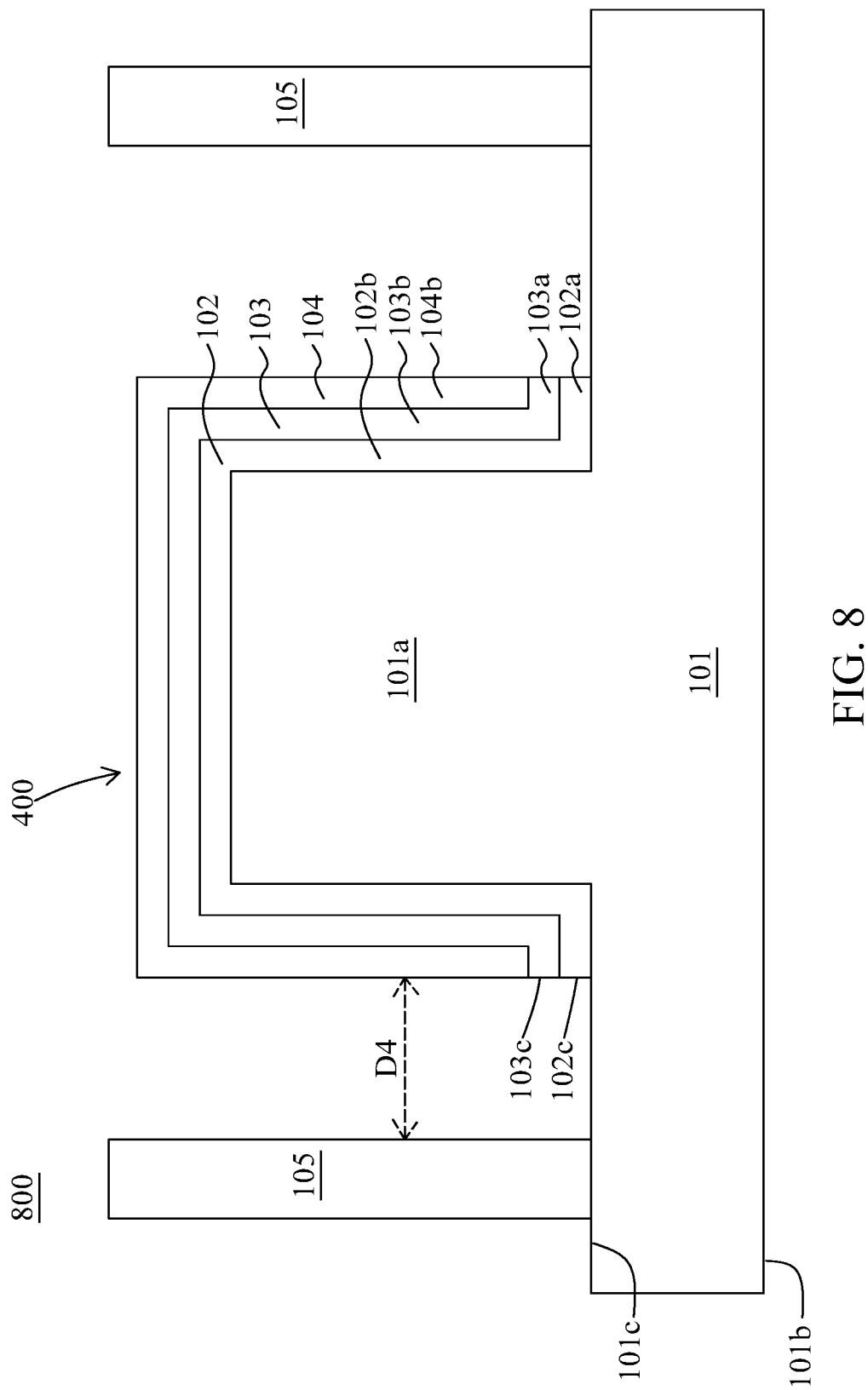
FIG. 8 is a cross-sectional side view of a memory device in accordance with other embodiments of the present disclosure.

FIG. 8 is a schematic cross-sectional side view of a memory device 800 in accordance with some embodiments of the present disclosure. The memory device 800 includes the memory device 400 of FIG. 4 and the contact plug 105 disposed over the semiconductor substrate 101. In some embodiments, the contact plug 105 is separated from the first protruding portion 102a or the second protruding portion 103a by the distance D3 of about 200 nm to about 500 nm.

Because the protrusion 110 protrudes from the semiconductive layer 102, the conductive layer 103 and the insulating layer 104 are reduced or shortened. A desirable distance between the protrusion 110 and the contact plug 105 can be maintained. Therefore, a short circuit or bridging can be prevented or minimized.

Figure 9:
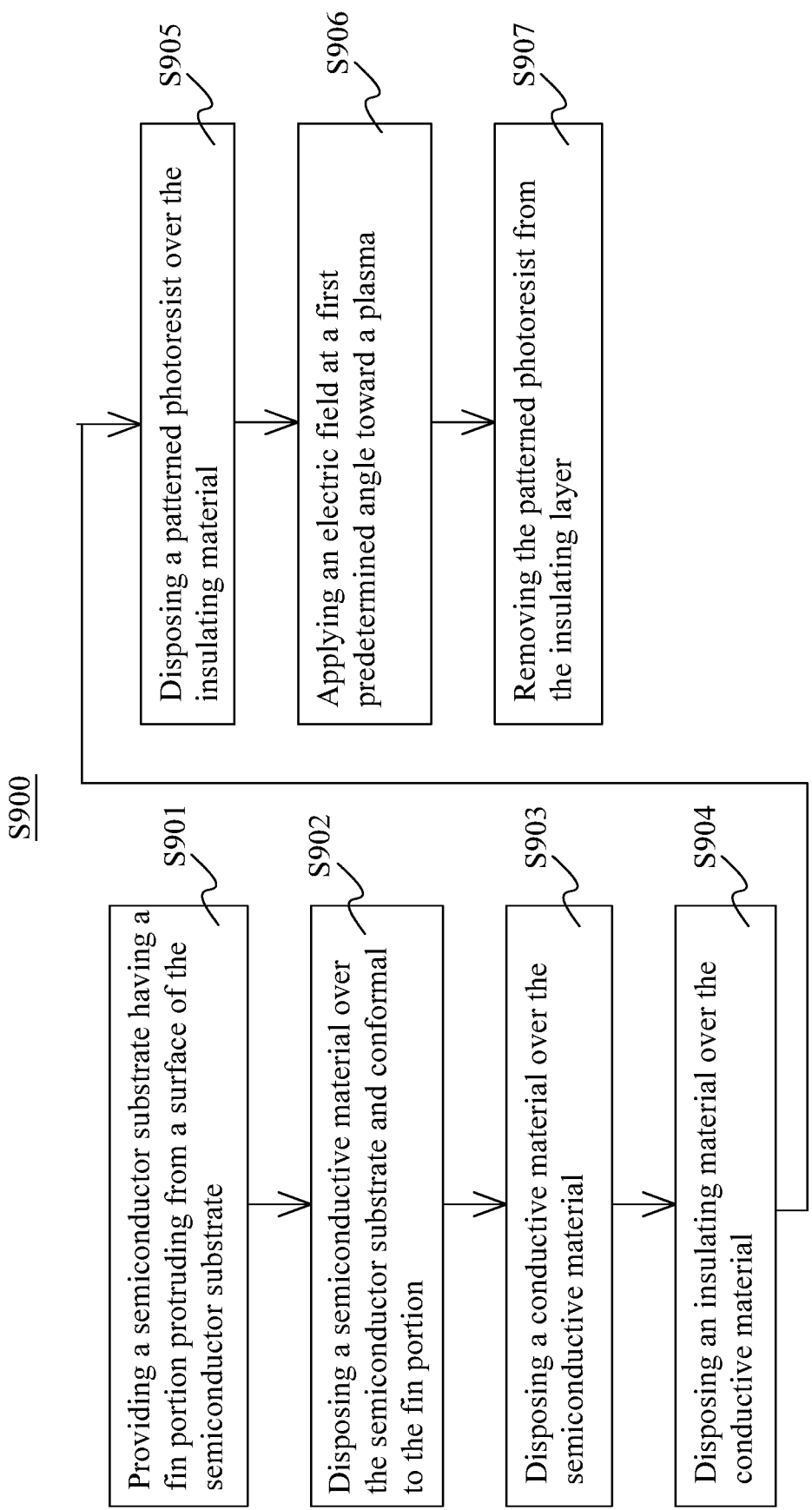
FIG. 9 is a flow diagram illustrating a method of manufacturing a memory device in accordance with some embodiments of the present disclosure.

FIG. 9 is a flow diagram illustrating a method S900 of manufacturing the memory device 100, 200, 300, 400, 500, 600, 700 or 800 in accordance with some embodiments of the present disclosure, and FIGS. 10 to 31 illustrate cross-sectional views of intermediate stages in formation of the memory device 100, 200, 300, 400, 500, 600, 700 or 800 in accordance with some embodiments of the present disclosure.

The stages shown in FIGS. 10 to 31 are also illustrated schematically in the flow diagram in FIG. 9. In following discussion, the fabrication stages shown in FIGS. 10 to 31 are discussed in reference to process steps shown in FIG. 9. The method S900 includes a number of operations, and description and illustration are not deemed as a limitation to a sequence of the operations. The method S900 includes a number of steps (S901, S902, S903, S904, S905, S906 and S907).

Figure 10:
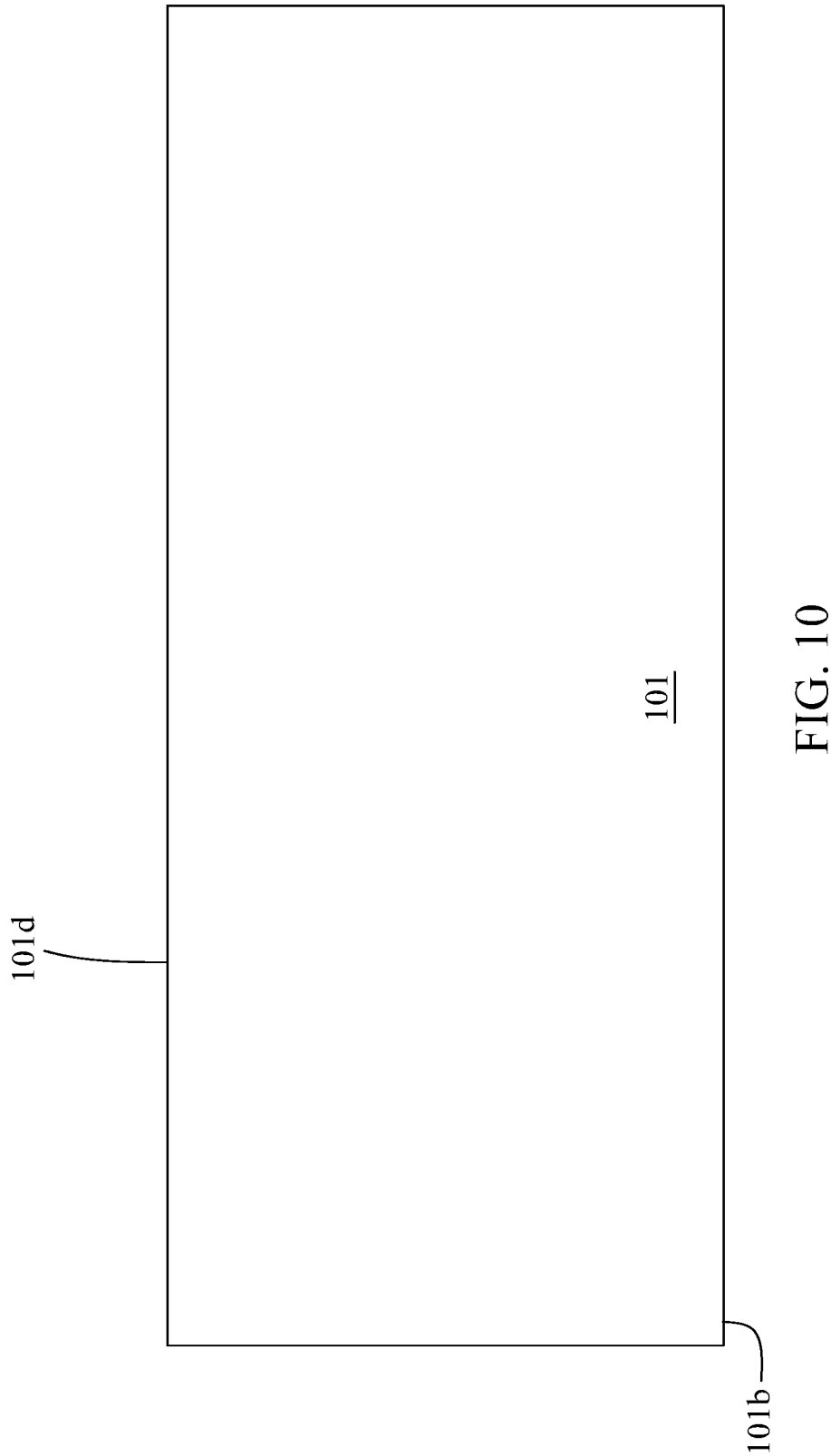
FIGS. 10 to 31 illustrate cross-sectional views of intermediate stages in the formation of a memory device in accordance with some embodiments of the present disclosure.
Figure 11:
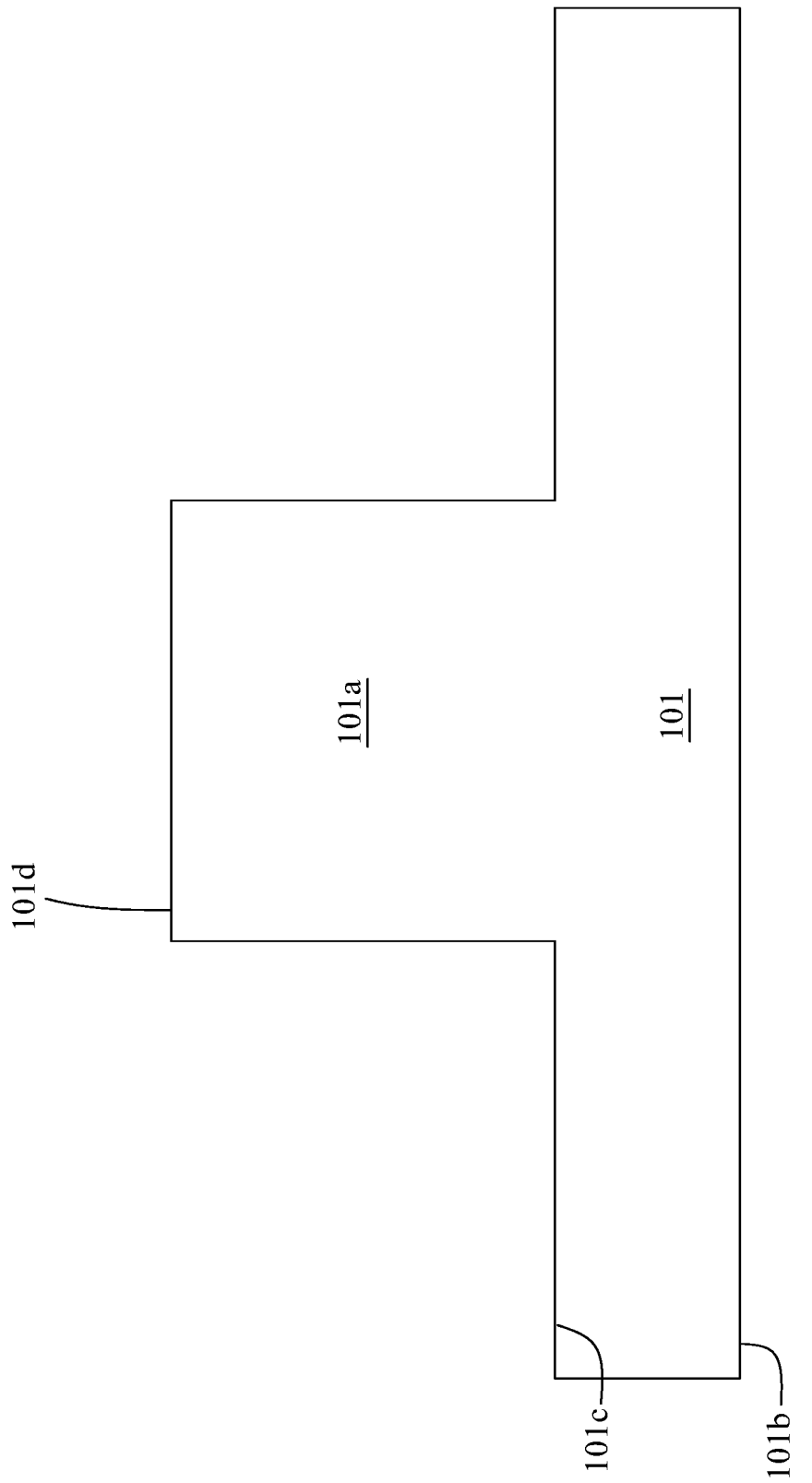

Referring to FIGS. 10 and 11, a semiconductor substrate 101 is provided according to step S901 in FIG. 9. In some embodiments, the semiconductor substrate 101 is defined with an active area and includes an isolation structure surrounding the active area. In some embodiments, the semiconductor substrate 101 includes a bottom surface 101b and a top surface 101d opposite to the bottom surface 101b.

In some embodiments as shown in FIG. 11, the semiconductor substrate 101 has a fin portion 101a protruding from the semiconductor substrate 101. In some embodiments, the fin portion 101a is formed by removing some portions of the semiconductor substrate 101 from the top surface 101d toward the bottom surface 101b. In some embodiments, another top surface 101c of the semiconductor substrate 101 is formed after the removal. In some embodiments, the fin portion 101a has the top surface 101d.

Figure 12:
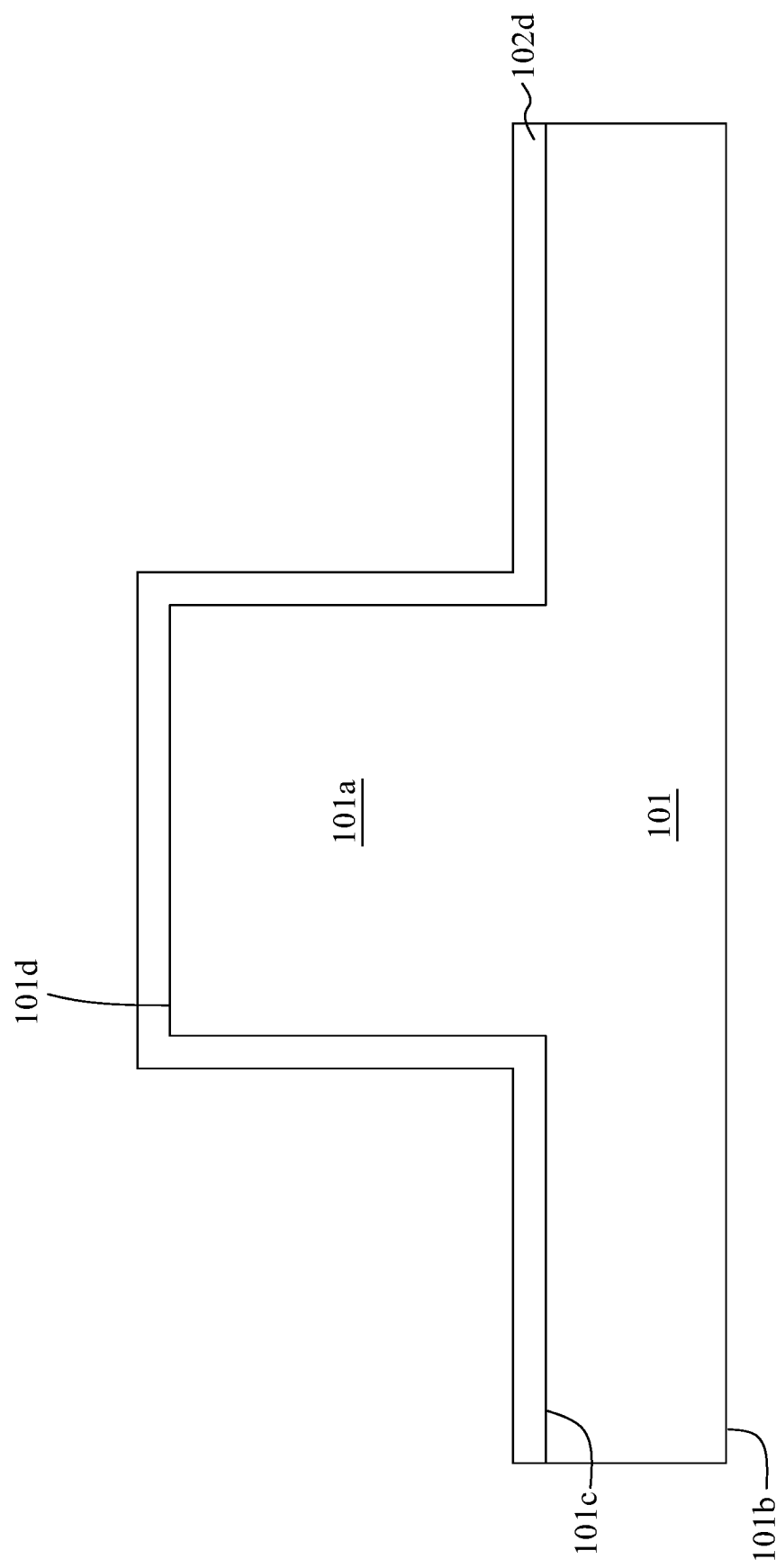

Referring to FIG. 12, a semiconductive material 102d is disposed over the semiconductor substrate 101 and conformal to the fin portion 101a according to step S902 in FIG. 9. In some embodiments, the semiconductive material 102d is disposed over the top surface 101c and a surface of the fin portion 101a. In some embodiments, the semiconductive material 102d is disposed by deposition or any other suitable process. In some embodiments, the semiconductive material 102d includes polysilicon.

Figure 13:
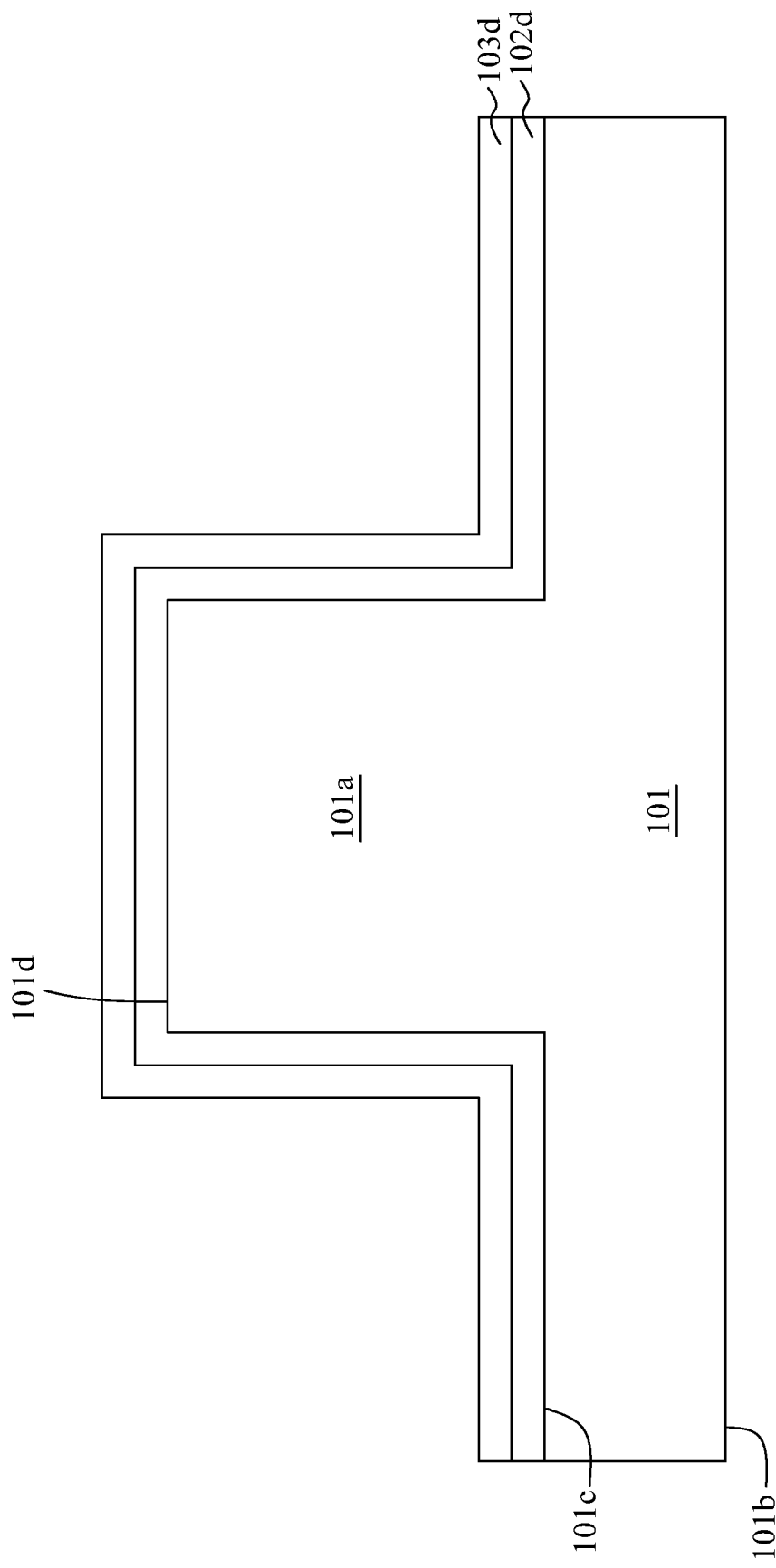

Referring to FIG. 13, a conductive material 103d is disposed over the semiconductive material 102d according to step S903 in FIG. 9. In some embodiments, the conductive material 103d is disposed by deposition or any other suitable process. In some embodiments, the conductive material 103d includes tungsten.

Figure 14:
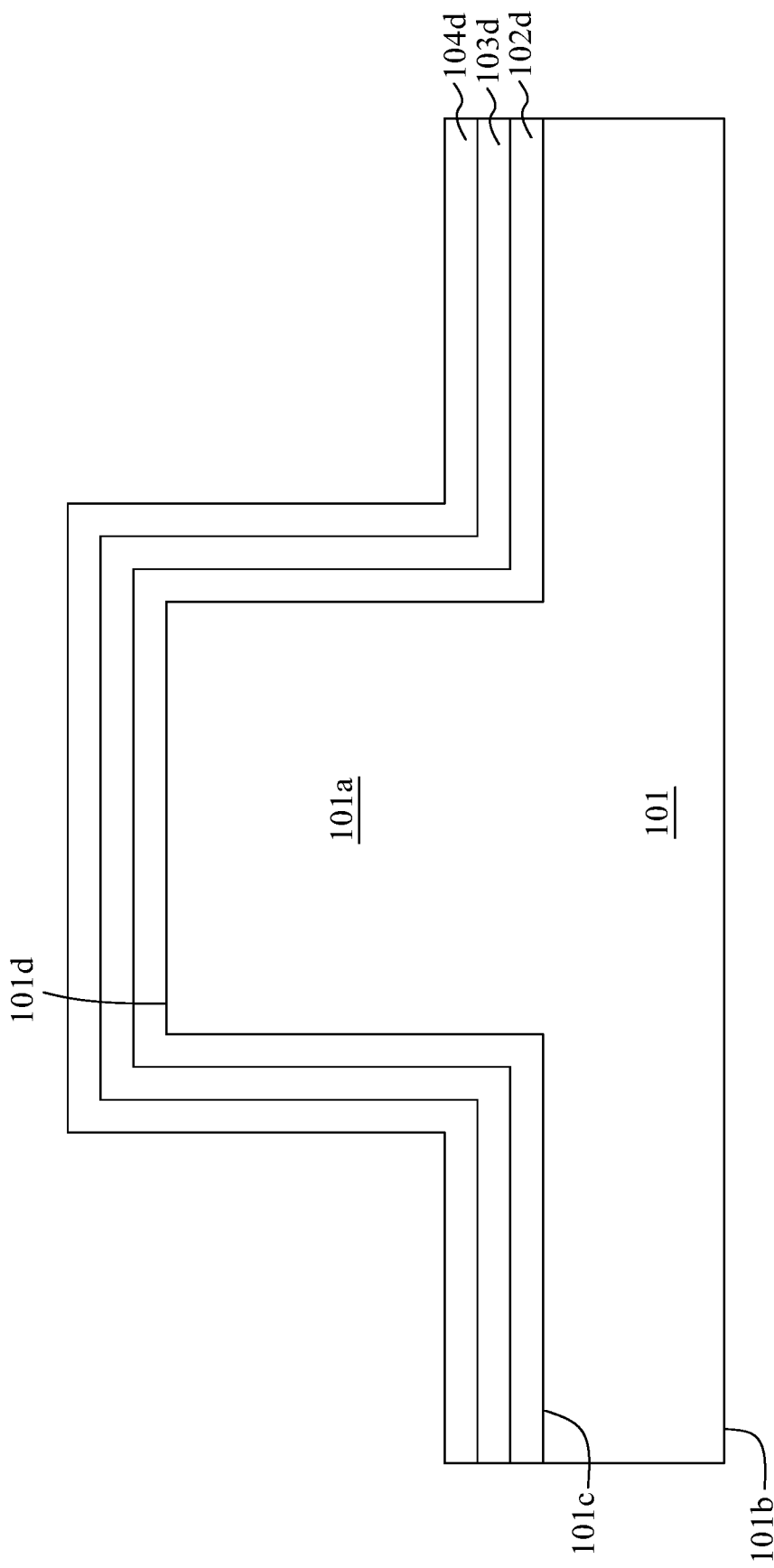

Referring to FIG. 14, an insulating material 104d is disposed over the conductive material 103d according to step S904 in FIG. 9. In some embodiments, the insulating material 104d is disposed by deposition, chemical vapor deposition (CVD) or any other suitable process. In some embodiments, the insulating material 104d includes oxide.

Figure 15:
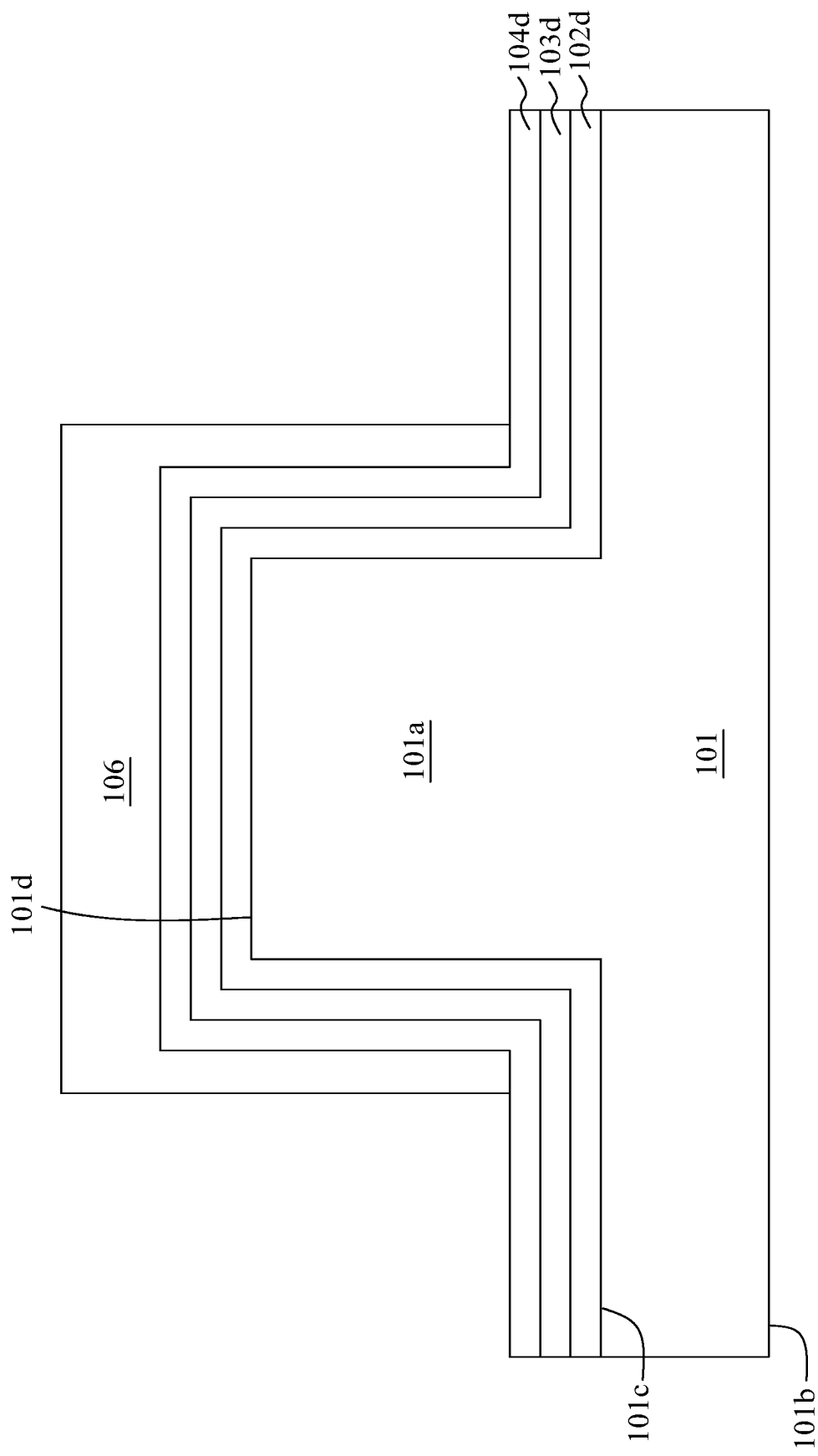

Referring to FIG. 15, a patterned photoresist 106 is disposed over the insulating material 104d according to step S905 in FIG. 9. In some embodiments, the patterned photoresist 106 is formed over the insulating material 104d by disposing a photoresist material over the insulating material 104d and then removing some portions of the photoresist material to become the patterned photoresist 106. In some embodiments, some portions of the semiconductive material 102d, the conductive material 103d and the insulating material 104d are not covered by the patterned photoresist 106. The insulating material 104d is at least partially exposed through the patterned photoresist 106.

Figure 16:
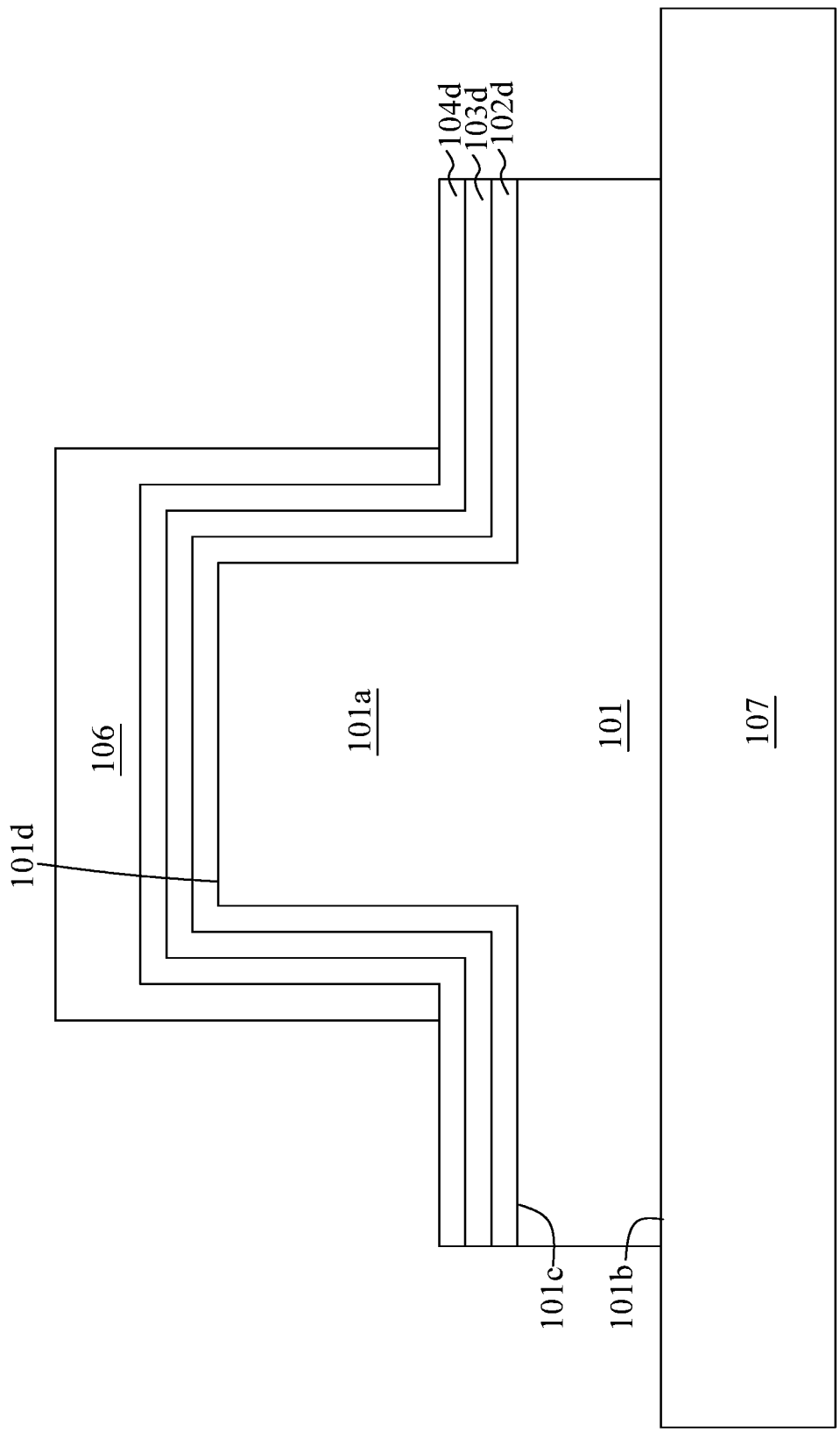

Referring to FIG. 16, an intermediate structure as shown in FIG. 15 is electrically connected to a cathode 107. In some embodiments, the cathode 107 is placed under the semiconductor substrate 101 and is configured to provide a positive bias to the intermediate structure of FIG. 15.

Figure 17:
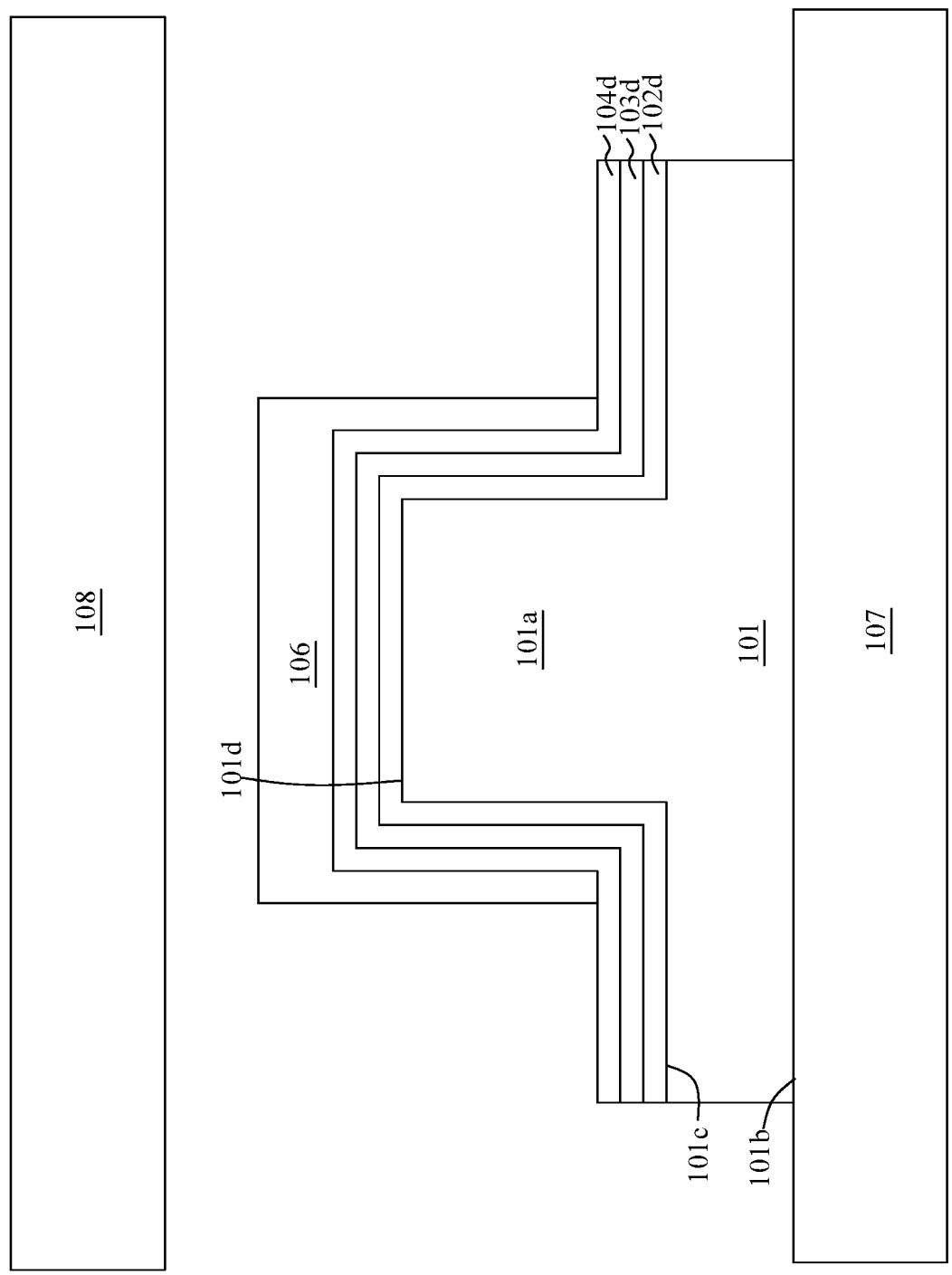

Referring to FIG. 17, an anode 108 is placed above the intermediate structure of FIG. 15. In some embodiments, the anode 108 is placed over the patterned photoresist 106 and the insulating material 104d, and is configured to provide a negative bias over the intermediate structure of FIG. 15.

Figure 18:
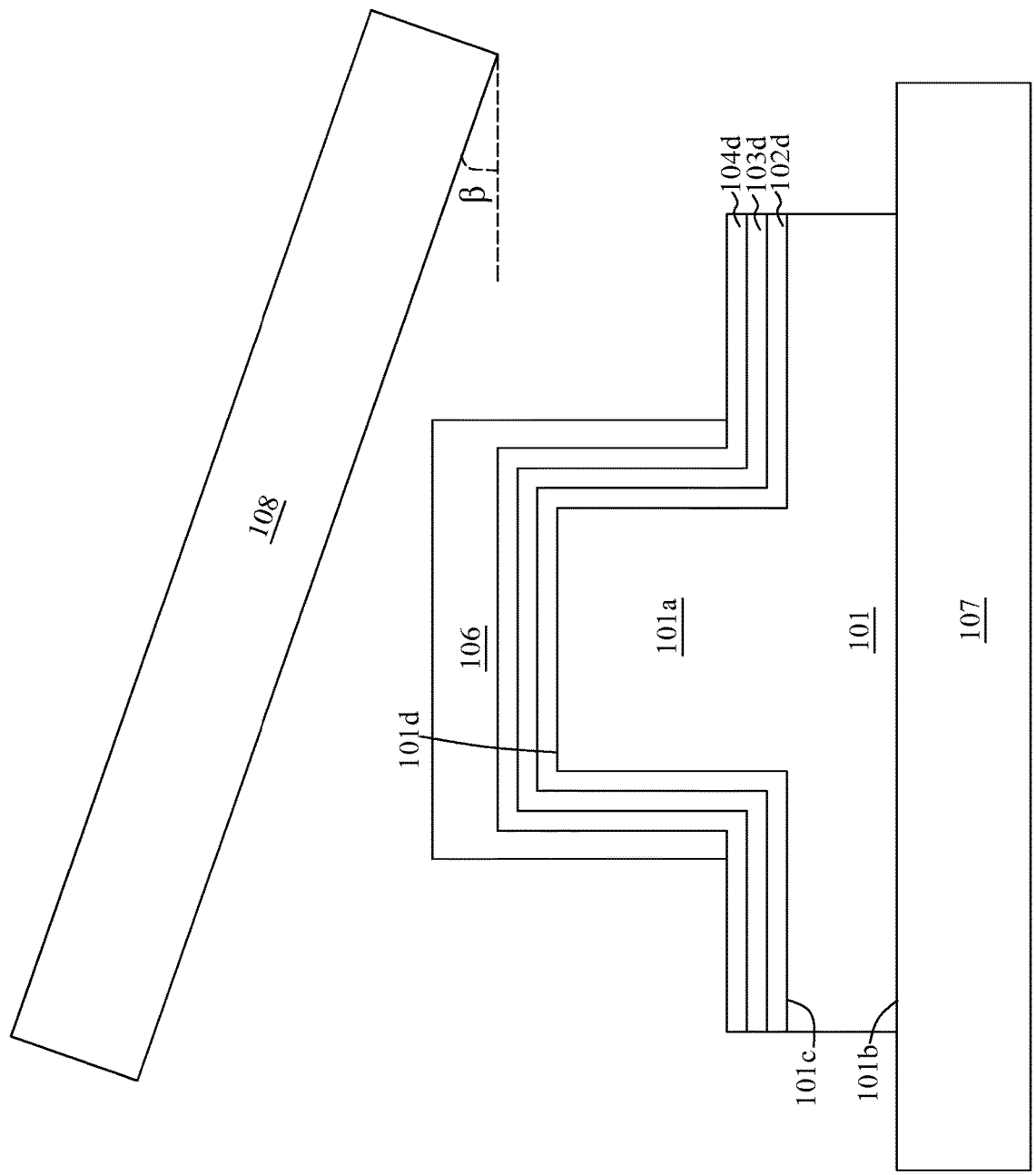

Referring to FIG. 18, the anode 108 is displaced to incline at a second predetermined angle β relative to the cathode 107. In some embodiments, the second predetermined angle β is in a range of about 40° to about 85°.

Figure 19:
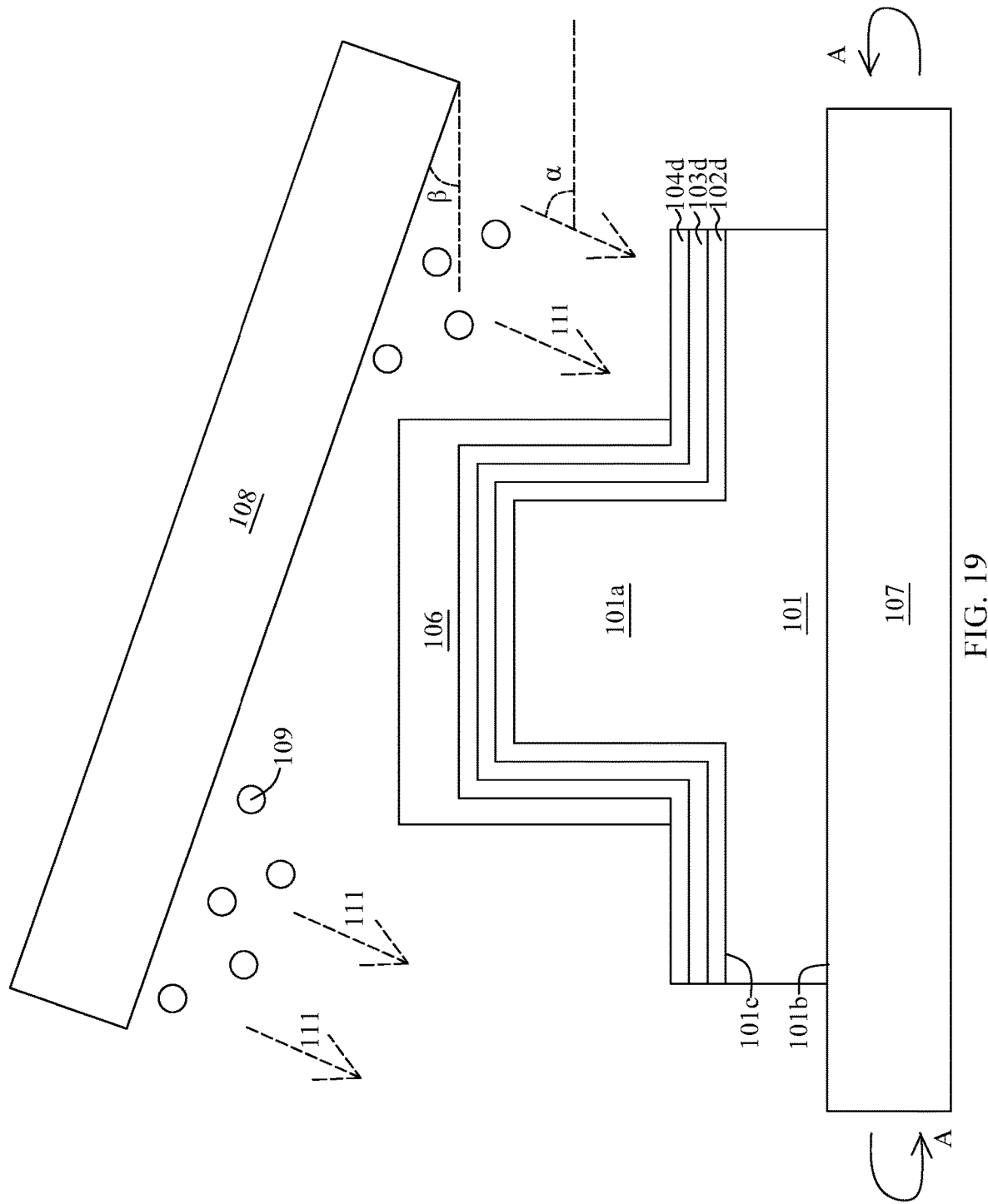

Referring to FIG. 19, an electric field 111 at a first predetermined angle α toward a plasma 109 is applied according to step S906 in FIG. 9. In some embodiments, the electric field 111 is provided by biasing the cathode 107 and the anode 108. In some embodiments, the electric field 111 is provided at the first predetermined angle α in a range of about 5° to about 50°. In some embodiments, the semiconductor substrate 101 is rotated as illustrated by an arrow A during the application of the electric field 111. In some embodiments, the plasma 109 is an ionized gas. In some embodiments, the plasma 109 includes oxygen, chlorine or the like.

Figure 20:
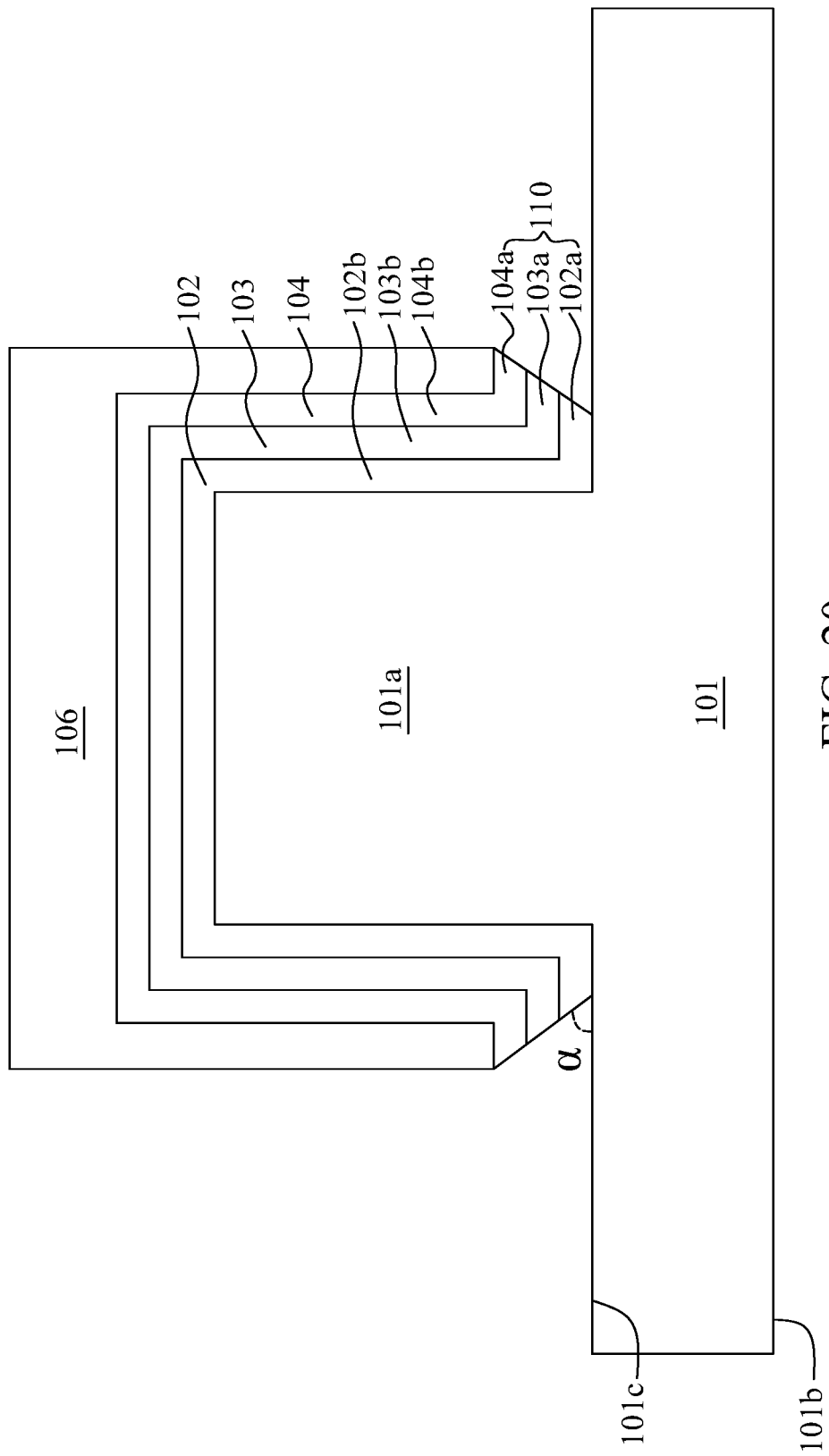

Referring to FIG. 20, the electric field 111 is applied at the first predetermined angle α to remove a portion of the insulating material 104d exposed through the patterned photoresist 106, a portion of the conductive material 103d under the portion of the insulating material 104d, and a portion of the semiconductive material 102d under the portion of the conductive material 103d. In some embodiments, the portion of the insulating material 104d, the portion of the conductive material 103d and the portion of the semiconductive material 102d are removed sequentially or simultaneously.

In some embodiments, the portion of the insulating material 104d, the portion of the conductive material 103d and the portion of the semiconductive material 102d are removed by a dry etching process. In some embodiments, the portion of the insulating material 104d, the portion of the conductive material 103d and the portion of the semiconductive material 102d are removed by the plasma 109 bombarding on the insulating material 104d, the conductive material 103d and the semiconductive material 102d, respectively. In some embodiments, the plasma 109 is bombarded on the portion of the insulating material 104d, the portion of the conductive material 103d and the portion of the semiconductive material 102d at the first predetermined angle α.

In some embodiments, an insulating layer 104, a conductive layer 103 and a semiconductive layer 102 are formed after the dry etching process. After the dry etching process, the cathode 107 and the anode 108 are removed or electrically disconnected. In some embodiments, after the application of the electric field 111 or after the dry etching process, the semiconductive layer 102 including a first protruding portion 102a laterally protruding from a first elongated portion 102b and along the top surface 101c, the conductive layer 103 including a second protruding portion 103a laterally protruding from a second elongated portion 103b and over the first protruding portion 102a, and the insulating layer 104 including a third protruding portion 104a laterally protruding from a third elongated portion 104b and over the second protruding portion 103a are formed.

In some embodiments, a protrusion 110 comprising the first protruding portion 102a, the second protruding portion 103a and the third protruding portion 104a is formed. In some embodiments, an exterior angle α between the protrusion 110 and the top surface 101c is substantially equal to the first predetermined angle α. In some embodiments, the exterior angle α is in a range of about 5° to about 50°.

Figure 21:
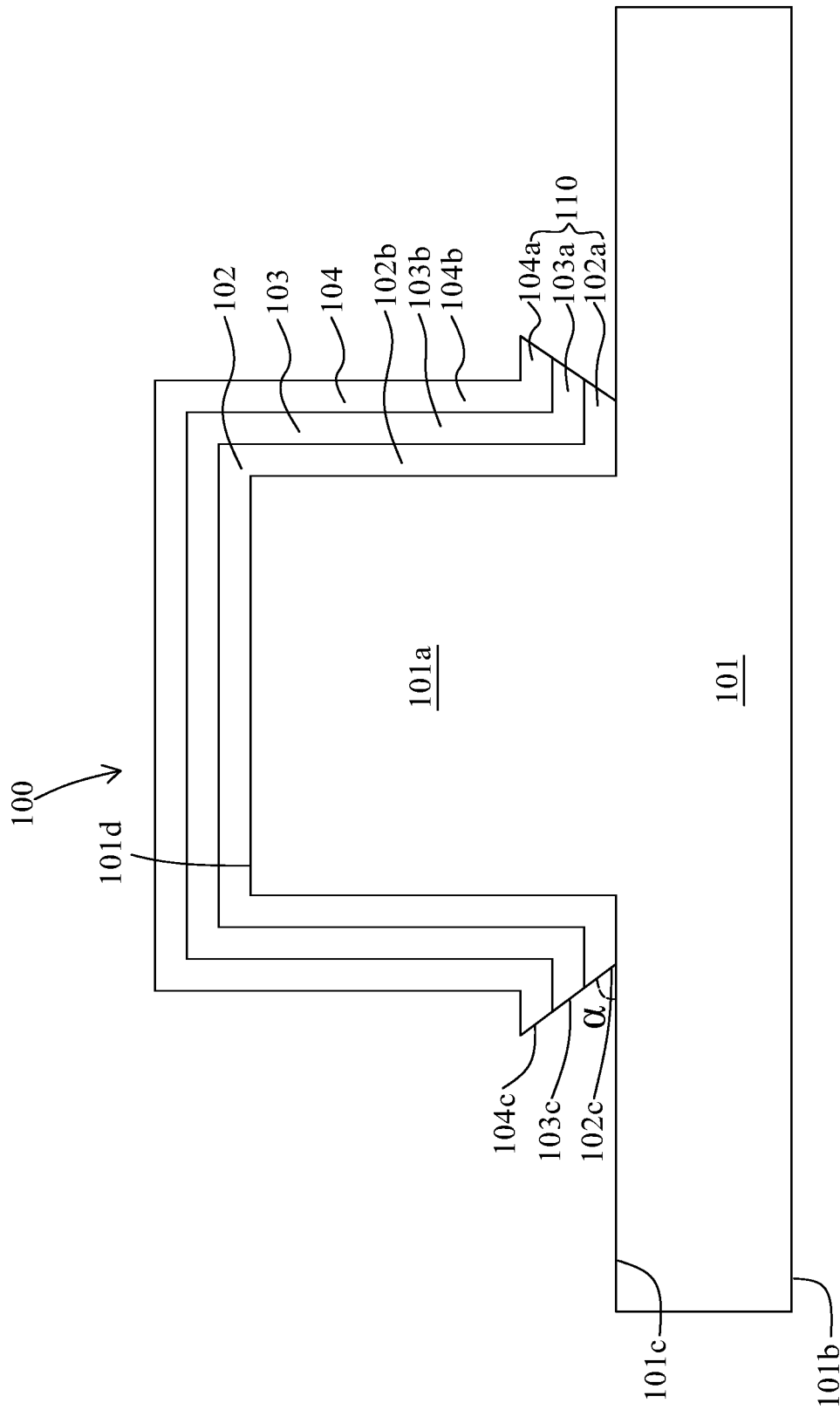

Referring to FIG. 21, the patterned photoresist 106 is removed from the insulating layer 104 according to step S907 in FIG. 9. In some embodiments, the patterned photoresist 106 is removed by etching, stripping or any other suitable process. In some embodiments, the memory device 100 of FIG. 1 is formed.

Figure 22:
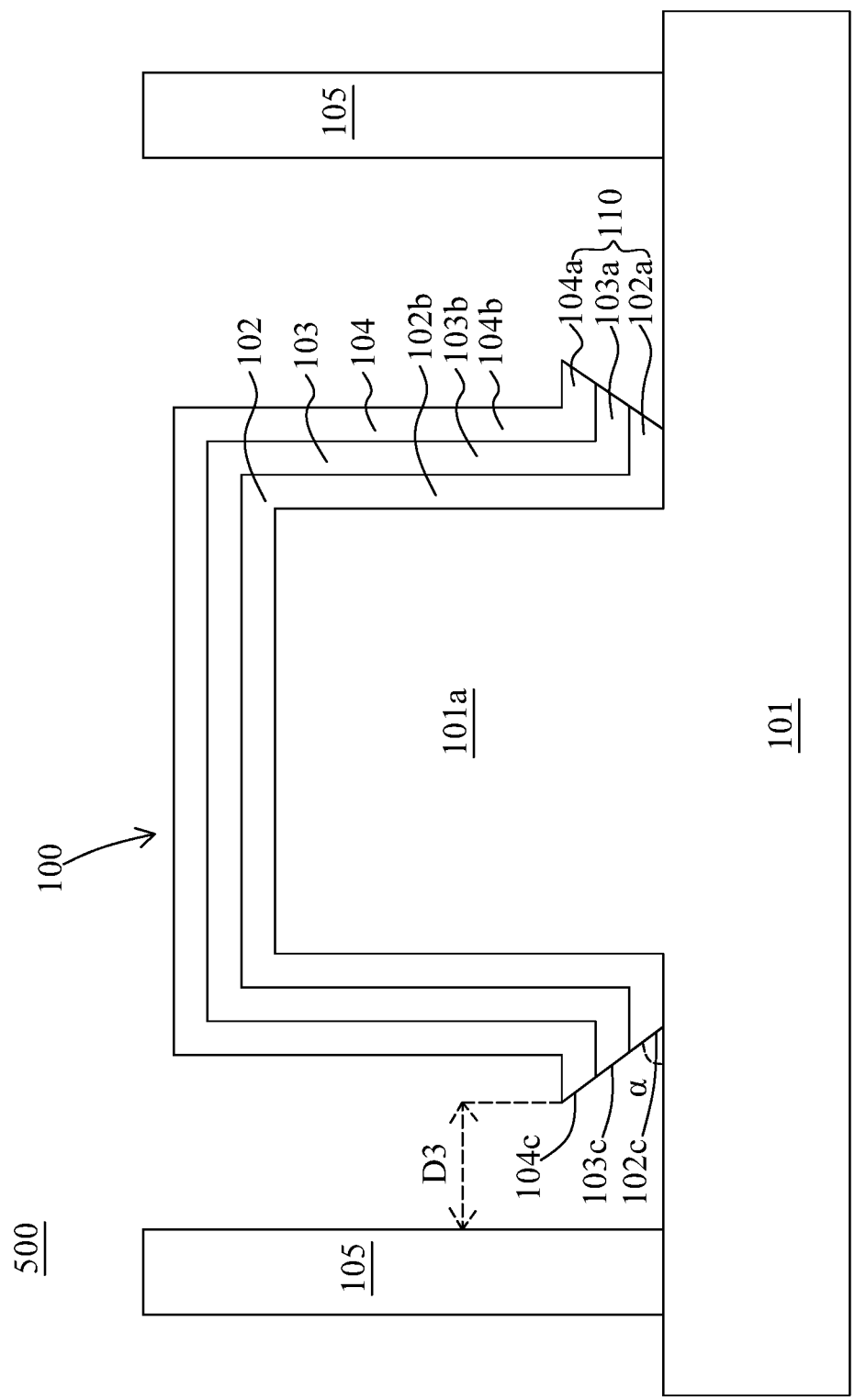

Referring to FIG. 22, a contact plug 105 is formed over the semiconductor substrate 101 and disposed adjacent to the first protruding portion 102a, the second protruding portion 103a and the third protruding portion 104a. In some embodiments, the contact plug 105 is formed by deposition or any other suitable process. In some embodiments, the contact plug 105 is separated from the third protruding portion 104a by a distance D3 of about 200 nm to about 500 nm. In some embodiments, the memory device 500 of FIG. 5 is formed.

Figure 23:
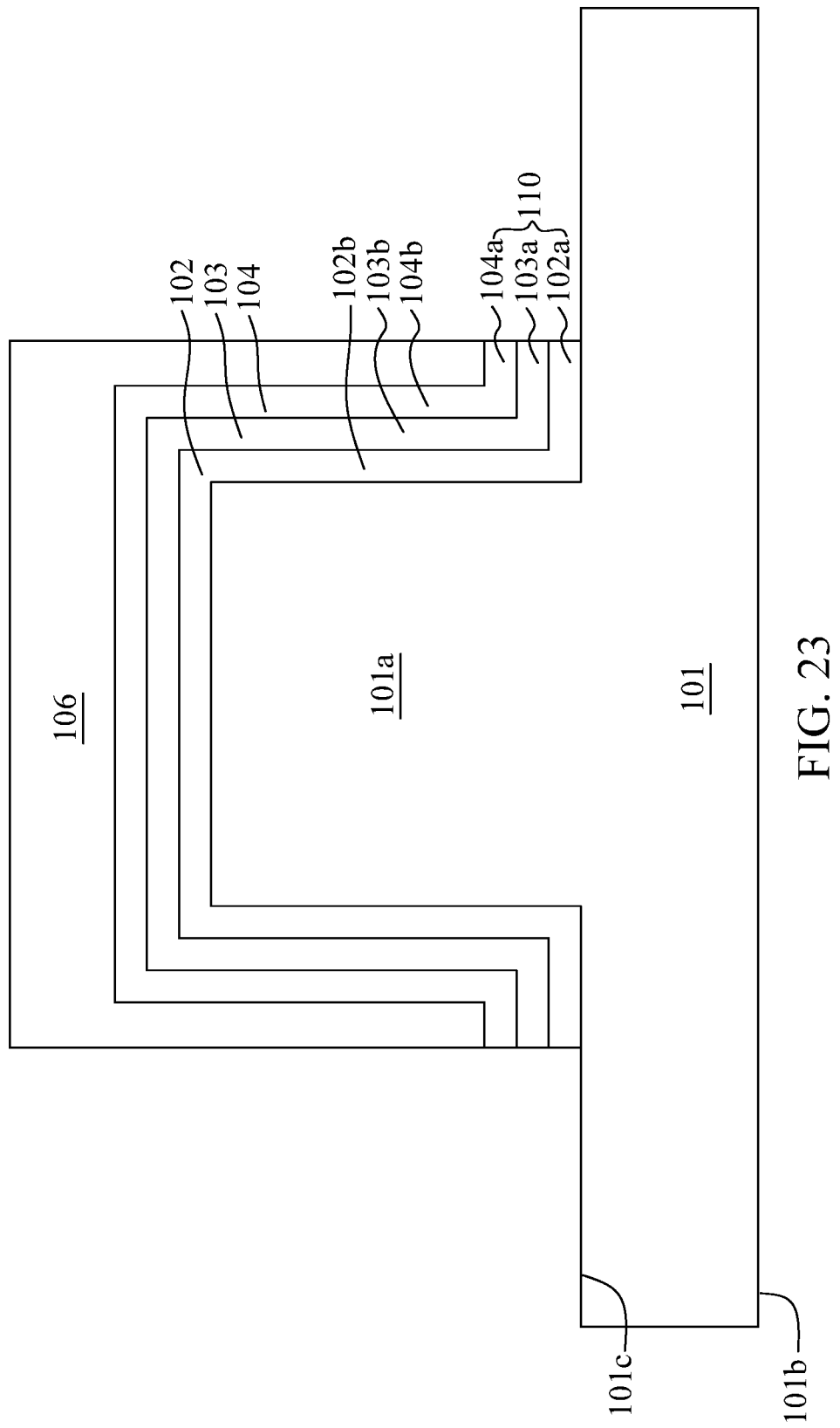

In some embodiments, the memory device 200 of FIG. 2 can be formed by the following steps after the application of the electric field 111 or after the dry etching process as shown in FIG. 19. After the application of the electric field 111 or the dry etching process, the semiconductive layer 102 including the first protruding portion 102a laterally protruding from the first elongated portion 102b and along the top surface 101c, the conductive layer 103 including the second protruding portion 103a laterally protruding from the second elongated portion 103b and over the first protruding portion 102a, and the insulating layer 104 including the third protruding portion 104a laterally protruding from the third elongated portion 104b and over the second protruding portion 103a are formed as shown in FIG. 23.

Figure 24:
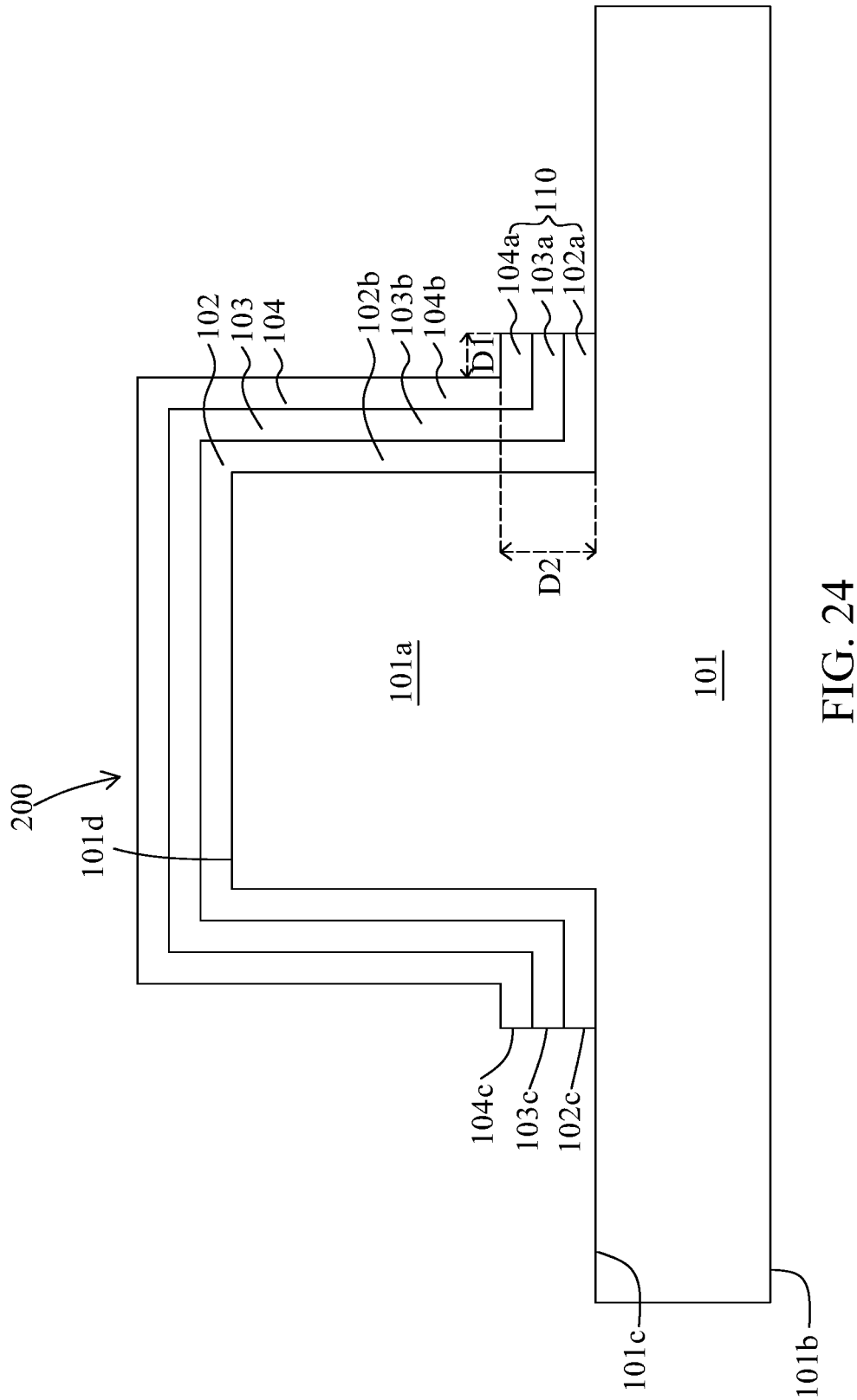
Figure 25:
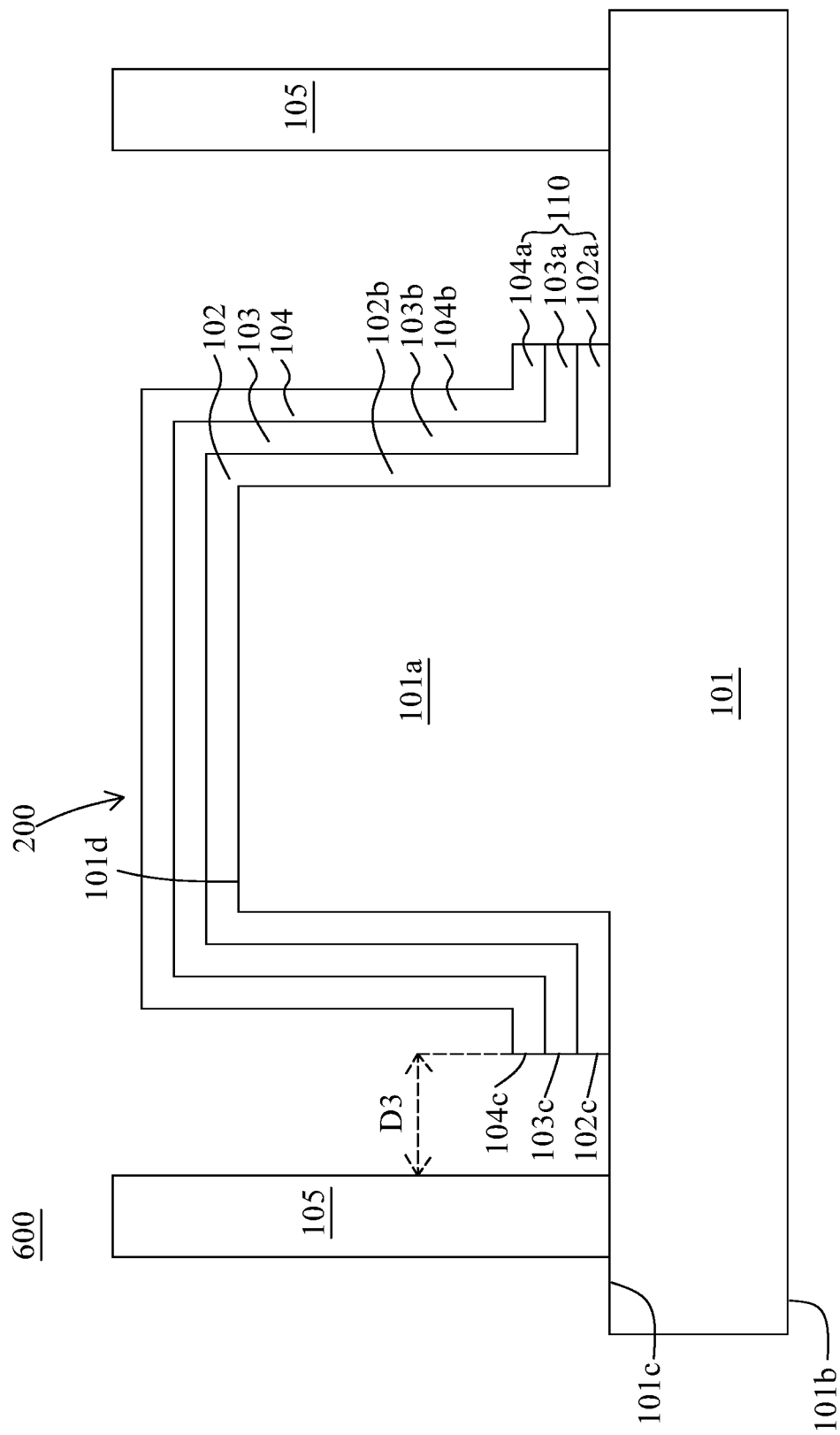

In some embodiments, the patterned photoresist 106 is removed, and then the memory device 200 of FIG. 2 is formed as shown in FIG. 24. In some embodiments, the memory device 600 of FIG. 6 can be formed after the formation of the contact plug 105 as shown in FIG. 25.

Figure 26:
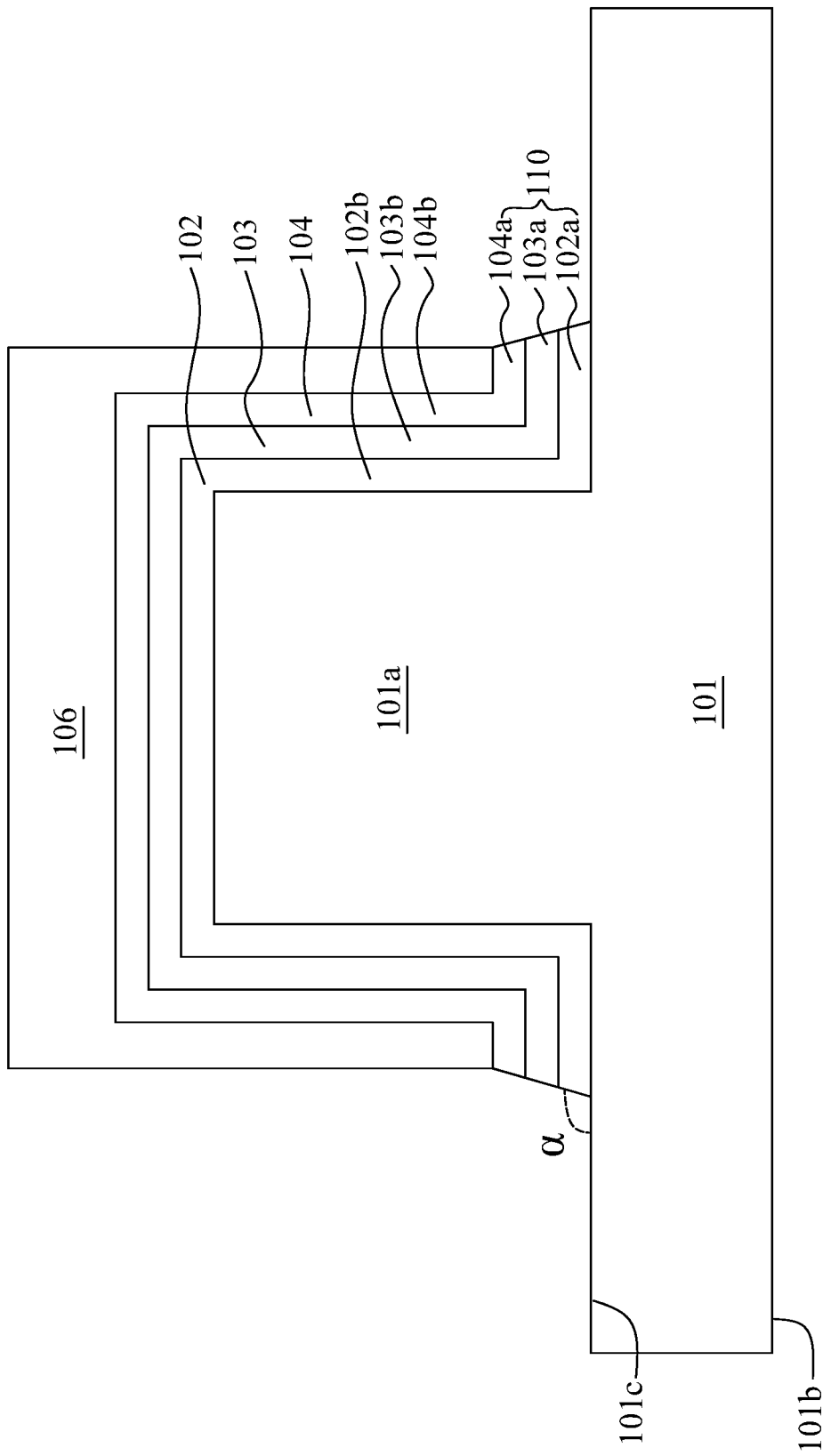

In some embodiments, the memory device 300 of FIG. 3 can be formed by the following steps after the application of the electric field 111 or after the dry etching process as shown in FIG. 19. After the application of the electric field 111 or the dry etching process, the semiconductive layer 102 including the first protruding portion 102a laterally protruding from the first elongated portion 102b and along the top surface 101c, the conductive layer 103 including the second protruding portion 103a laterally protruding from the second elongated portion 103b and over the first protruding portion 102a, and the insulating layer 104 including the third protruding portion 104a laterally protruding from the third elongated portion 104b and over the second protruding portion 103a are formed as shown in FIG. 26.

Figure 27:
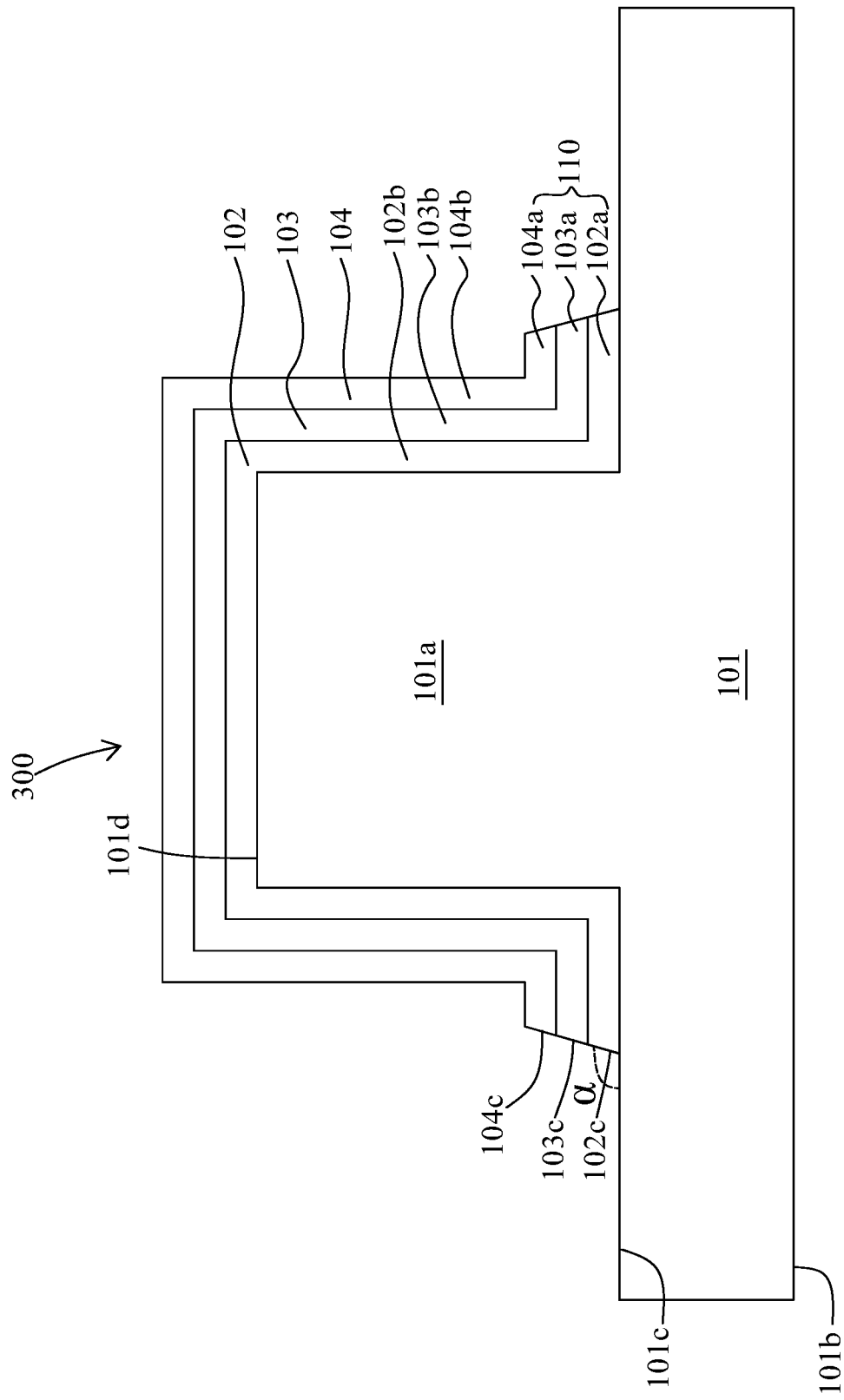
Figure 28:
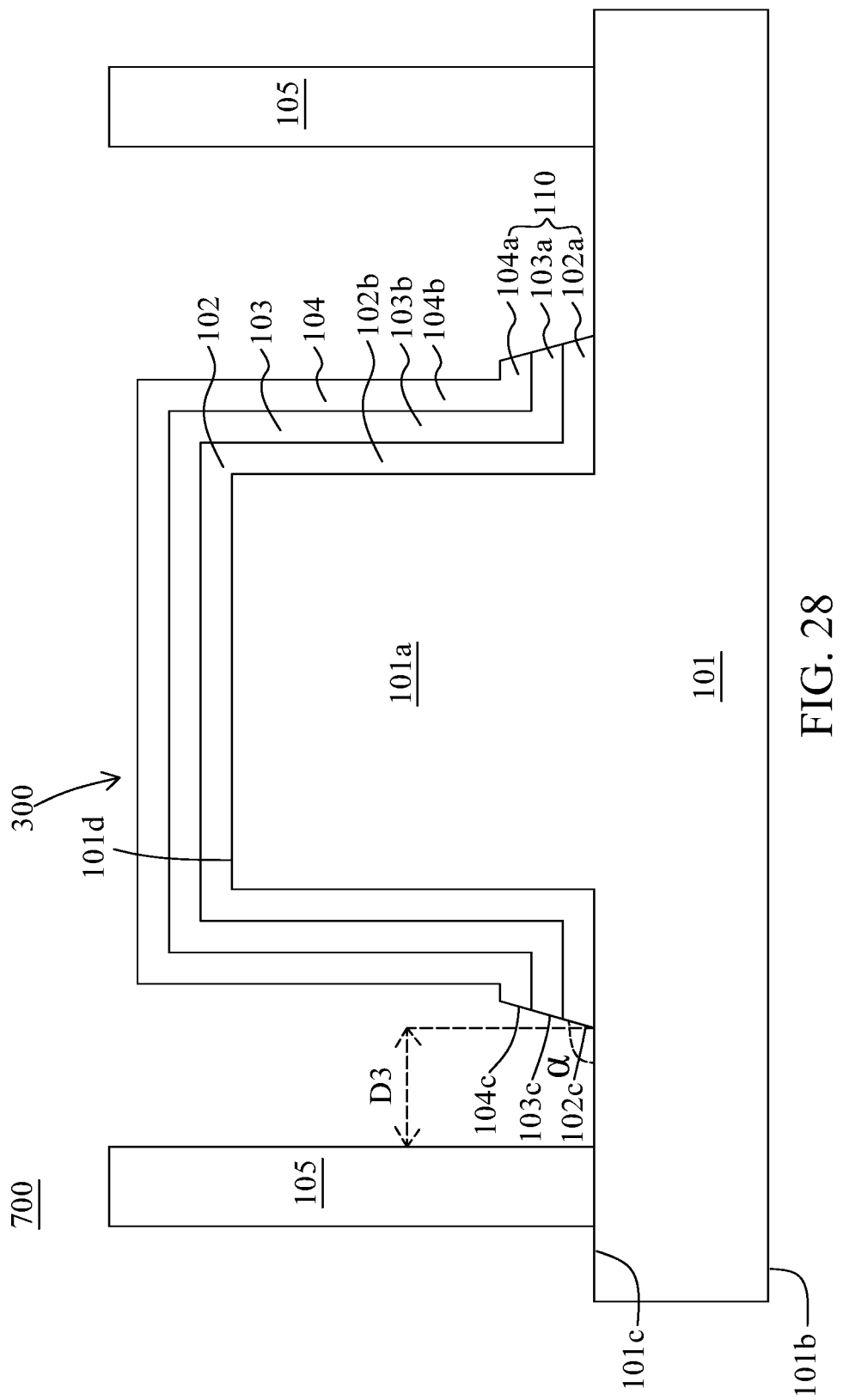

In some embodiments, the patterned photoresist 106 is removed, and then the memory device 300 of FIG. 3 is formed as shown in FIG. 27. In some embodiments, the memory device 700 of FIG. 7 can be formed after the formation of the contact plug 105 as shown in FIG. 28.

Figure 29:
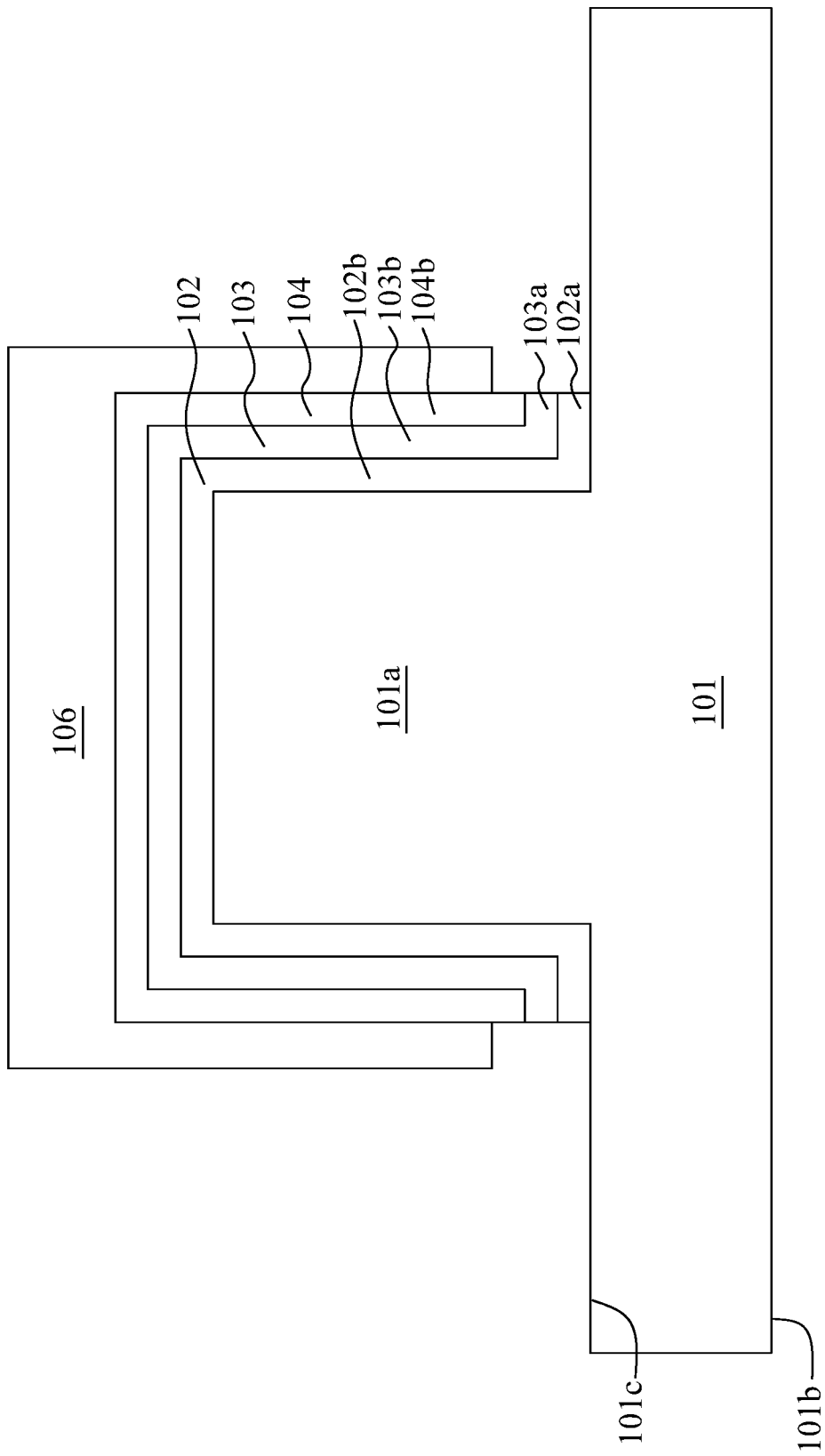

In some embodiments, the memory device 400 of FIG. 4 can be formed by the following steps after the application of the electric field 111 or after the dry etching process as shown in FIG. 19. After the application of the electric field 111 or the dry etching process, the semiconductive layer 102 including the first protruding portion 102a laterally protruding from the first elongated portion 102b and along the top surface 101c, and the conductive layer 103 including the second protruding portion 103a laterally protruding from the second elongated portion 103b and over the first protruding portion 102a are formed as shown in FIG. 29.

Figure 30:
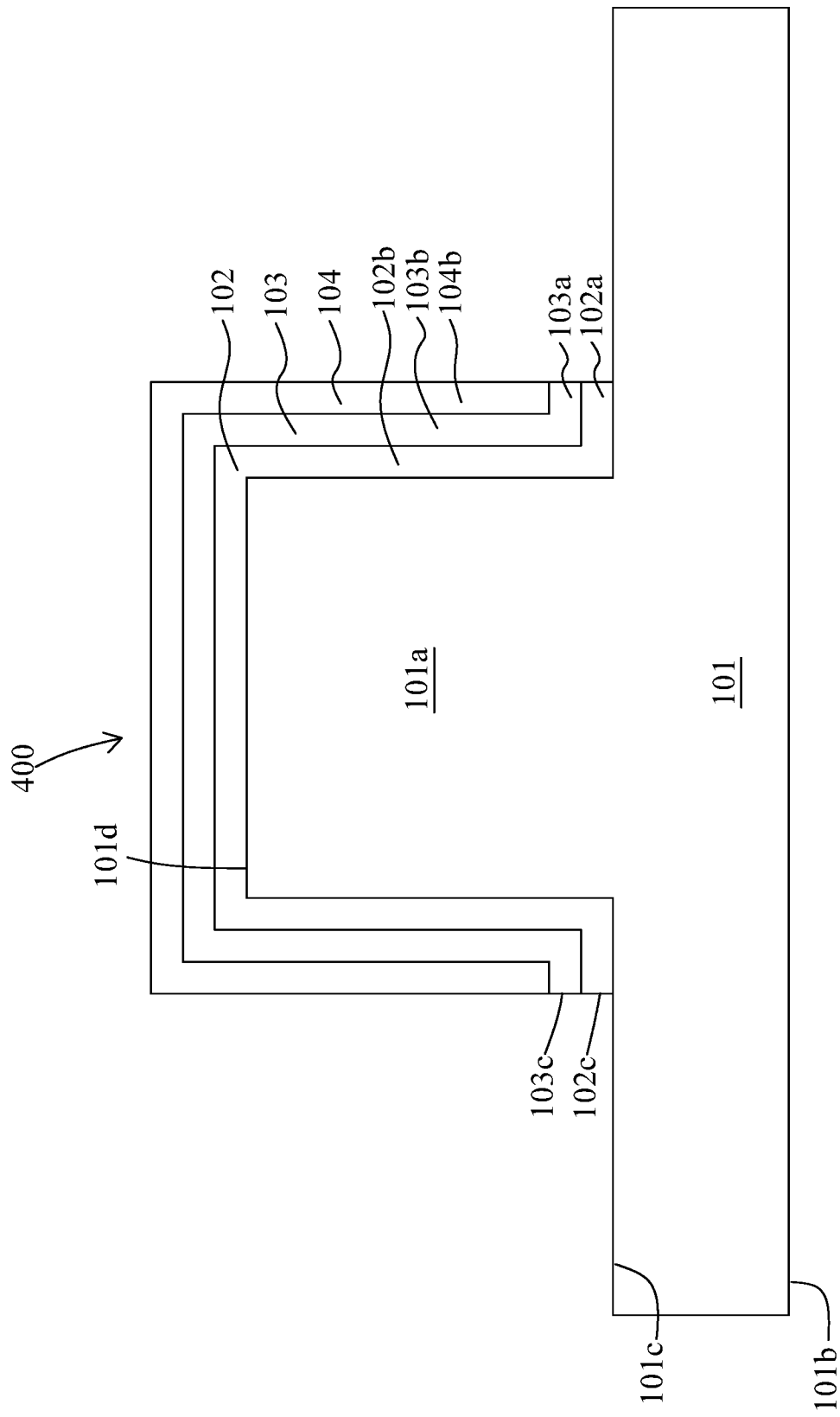
Figure 31:
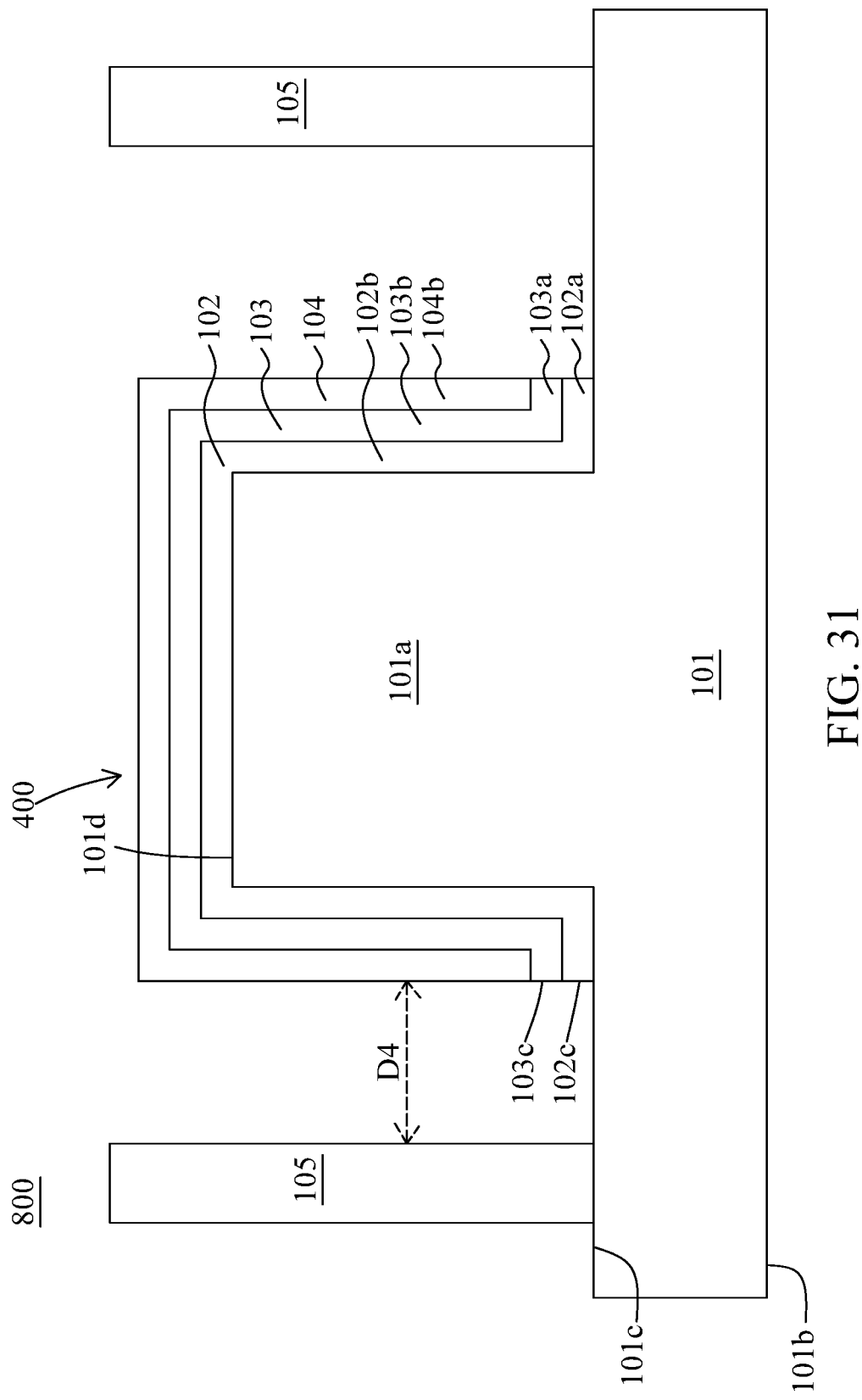

In some embodiments, the patterned photoresist 106 is removed, and then the memory device 400 of FIG. 4 is formed as shown in FIG. 30. In some embodiments, the memory device 800 of FIG. 8 can be formed after the formation of the contact plug 105 as shown in FIG. 31.

In an aspect of the present disclosure, a memory device is provided. The memory device includes a semiconductor substrate having a fin portion protruding from a surface of the semiconductor substrate; a semiconductive layer disposed conformal to the fin portion; a conductive layer disposed over the semiconductive layer; an insulating layer disposed over the conductive layer; and a protrusion including a first protruding portion laterally protruding from the semiconductive layer and along the surface, a second protruding portion laterally protruding from the conductive layer and over the first protruding portion, and a third protruding portion laterally protruding from the insulating layer and over the second protruding portion, wherein the protrusion has an undercut profile, and the third protruding portion protrudes farther than the first protruding portion.

In another aspect of the present disclosure, a memory device is provided. The memory device includes a semiconductor substrate having a fin portion protruding from a surface of the semiconductor substrate; a semiconductive layer disposed conformal to the fin portion and having a first protruding portion laterally protruding away from the fin portion and along the surface; a conductive layer disposed conformal to the semiconductive layer and having a second protruding portion laterally protruding away from the fin portion and over the first protruding portion; and an insulating layer disposed conformal to the conductive layer and having a third protruding portion laterally protruding away from the fin portion and over the second protruding portion, wherein a length of the third protruding portion is substantially less than 300 nm.

In another aspect of the present disclosure, a method of manufacturing a memory device is provided. The method includes steps of providing a semiconductor substrate having a fin portion protruding from a surface of the semiconductor substrate; disposing a semiconductive material over the semiconductor substrate and conformal to the fin portion; disposing a conductive material over the semiconductive material; disposing an insulating material over the conductive material; disposing a patterned photoresist over the insulating material; applying an electric field at a predetermined angle toward a plasma to remove a portion of the insulating material exposed through the patterned photoresist to form an insulating layer, to remove a portion of the conductive material under the portion of the insulating material to form a conductive layer, and to remove a portion of the semiconductive material under the portion of the insulating material to form a semiconductive layer; and removing the patterned photoresist from the insulating layer.

In conclusion, because an electric field at a predetermined angle is applied during a dry etching process, a plasma is bombarded on a memory cell at the predetermined angle to remove some portions of a semiconductive layer, a conductive layer and an insulating layer of the memory cell by the dry etching process. A protrusion formed and protruding from the semiconductive layer, the conductive layer and the insulating layer can be reduced or shortened. Therefore, a short circuit or bridging between the memory cell and a contact plug adjacent to the memory cell can be prevented or minimized.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A memory device, comprising:
   a semiconductor substrate having a fin portion protruding from a surface of the semiconductor substrate;
   a semiconductive layer disposed conformal to the fin portion;
   a conductive layer disposed over the semiconductive layer;
   an insulating layer disposed over the conductive layer; and
   a protrusion including a first protruding portion laterally protruding from the semiconductive layer and along the surface, a second protruding portion laterally protruding from the conductive layer and over the first protruding portion, and a third protruding portion laterally protruding from the insulating layer and over the second protruding portion, wherein the protrusion has an undercut profile, and the third protruding portion protrudes farther than the first protruding portion.

2. The memory device according to claim 1, wherein the third protruding portion protrudes from the insulating layer by a length in a range of about 30 nm to about 300 nm.

3. The memory device according to claim 1, wherein an exterior angle between the protrusion and the surface is in a range of about 5° to about 50°.

4. The memory device according to claim 1, wherein the undercut profile comprises a first inclined sidewall of the first protruding portion, a second inclined sidewall of the second protruding portion and a third inclined sidewall of the third protruding portion.

5. The memory device according to claim 4, wherein the first inclined sidewall, the second inclined sidewall and the third inclined sidewall are substantially coplanar.

6. The memory device according to claim 4, wherein the first inclined sidewall is coupled with the second inclined sidewall, and the second inclined sidewall is coupled with the third inclined sidewall.

7. The memory device according to claim 4, wherein the second inclined sidewall is disposed between the first inclined sidewall and the third inclined sidewall.

8. The memory device according to claim 1, wherein the semiconductive layer includes polysilicon, the conductive layer includes tungsten, the insulating layer includes oxide, and the contact plug includes tungsten (W).

9. The memory device according to claim 1, wherein a height of the protrusion from the surface is about 250 nm.

10. The memory device according to claim 1, further comprising a contact plug disposed over the semiconductor substrate, wherein the contact plug is separated from the protrusion by a distance substantially greater than 200 nm.

11. The memory device according to claim 10, wherein the distance is substantially less than 500 nm.

* * * * *